(12) United States Patent
Son et al.

(10) Patent No.: US 12,105,918 B2
(45) Date of Patent: Oct. 1, 2024

(54) DISPLAY DEVICE AND METHOD OF MANUFACTURING DISPLAY DEVICE

(71) Applicant: SAMSUNG DISPLAY CO., LTD., Yongin-si (KR)

(72) Inventors: Jungha Son, Yongin-si (KR); Gee-Bum Kim, Seoul (KR); Sangwoo Kim, Seoul (KR); Kijune Lee, Yongin-si (KR); Taekyung Ahn, Yongin-si (KR); Byung Han Yoo, Suwon-si (KR); Jaeik Lim, Hwaseong-si (KR); Chaungi Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/167,699

(22) Filed: Feb. 10, 2023

(65) Prior Publication Data
US 2023/0185411 A1    Jun. 15, 2023

Related U.S. Application Data

(63) Continuation of application No. 17/295,776, filed as application No. PCT/KR2019/012321 on Sep. 23, 2019, now Pat. No. 11,599,229.

(30) Foreign Application Priority Data

Dec. 10, 2018 (KR) .................. 10-2018-0158358

(51) Int. Cl.
*G06F 3/044* (2006.01)
*H10K 59/12* (2023.01)
(Continued)

(52) U.S. Cl.
CPC .......... *G06F 3/0443* (2019.05); *H10K 59/12* (2023.02); *H10K 59/40* (2023.02); *H10K 71/00* (2023.02);
(Continued)

(58) Field of Classification Search
CPC ......... G06F 3/0443; G06F 2203/04103; G06F 2203/04111; H10K 59/40; H10K 71/00; H10K 59/12; H10K 59/1201
See application file for complete search history.

(56) References Cited

U.S. PATENT DOCUMENTS

| | | | |
|---|---|---|---|
| 8,410,686 B2 | 4/2013 | Yamada et al. |
| 8,558,158 B2 | 10/2013 | Izuha et al. |
| (Continued) | | | |

FOREIGN PATENT DOCUMENTS

| | | | |
|---|---|---|---|
| JP | 2009-049135 A | 3/2009 |
| JP | 2013-178543 A | 9/2013 |
| (Continued) | | | |

OTHER PUBLICATIONS

International Search Report issued in corresponding International Application No. PCT/KR2019/012321, date Jan. 31, 2020, 4pp (with English Translation).

*Primary Examiner* — Afroza Chowdhury
(74) *Attorney, Agent, or Firm* — Lewis Roca Rothgerber Christie LLP

(57) ABSTRACT

Provided is a display device including a display panel having a plurality of pixel regions, a first insulating layer on the display panel, having a first refractive index, and having a plurality of first openings defined in regions which overlap the plurality of pixel regions, a second insulating layer directly on the first insulating layer and having a plurality of second openings defined in regions which correspond to the plurality of first openings, and a third insulating layer covering the display panel, the first insulating layer, and the second insulating layer and having a second refractive index higher than the first refractive index, wherein the third insulating layer may overlap the plurality of pixel regions on a plane.

20 Claims, 29 Drawing Sheets

(51) Int. Cl.
  *H10K 59/40*         (2023.01)
  *H10K 71/00*         (2023.01)
(52) U.S. Cl.
  CPC .............. *G06F 2203/04103* (2013.01); *G06F 2203/04111* (2013.01); *H10K 59/1201* (2023.02)

(56) References Cited

U.S. PATENT DOCUMENTS

| | | |
|---|---|---|
| 9,081,197 B2 | 7/2015 | Whangbo et al. |
| 9,130,181 B2 | 9/2015 | Choi et al. |
| 9,367,162 B2 | 6/2016 | Lee |
| 10,033,014 B2 | 7/2018 | Chen et al. |
| 10,079,365 B2 | 9/2018 | Kim et al. |
| 10,147,780 B2 | 12/2018 | Nakamura et al. |
| 10,312,299 B2 | 6/2019 | Jun et al. |
| 10,319,792 B2 | 6/2019 | Jo et al. |
| 10,319,948 B2 | 6/2019 | Kim et al. |
| 10,338,449 B2 | 7/2019 | Kang et al. |
| 10,505,142 B2 | 12/2019 | Oh |
| 10,572,080 B2 | 2/2020 | Lee et al. |
| 11,599,229 B2* | 3/2023 | Son ................. G06F 3/0412 |
| 2011/0058133 A1* | 3/2011 | Ishigaki ............ G02F 1/136227 349/138 |
| 2014/0034919 A1 | 2/2014 | Park et al. |
| 2014/0319484 A1* | 10/2014 | Kwon .................. H10K 50/813 257/40 |
| 2015/0194463 A1* | 7/2015 | Ukigaya ............ H01L 27/14689 438/73 |
| 2016/0320885 A1 | 11/2016 | Kim et al. |
| 2016/0364033 A1 | 12/2016 | Yang |
| 2016/0372636 A1 | 12/2016 | Hwang et al. |
| 2017/0062769 A1 | 3/2017 | Kim et al. |
| 2017/0357348 A1 | 12/2017 | Lee et al. |
| 2018/0033834 A1 | 2/2018 | Jun et al. |
| 2018/0138458 A1* | 5/2018 | Tokuda ................ H10K 50/844 |
| 2018/0334740 A1* | 11/2018 | Ikenaga ................... C25D 1/10 |
| 2018/0358581 A1 | 12/2018 | Kim et al. |
| 2019/0229156 A1 | 7/2019 | Jun et al. |
| 2019/0244000 A1 | 8/2019 | Son et al. |
| 2020/0052054 A1* | 2/2020 | Park .................... H10K 59/1213 |
| 2022/0121301 A1* | 4/2022 | Son ....................... G06F 3/0412 |

FOREIGN PATENT DOCUMENTS

| | | |
|---|---|---|
| JP | 2017-76123 A | 4/2017 |
| KR | 10-2013-0046998 A | 5/2013 |
| KR | 10-2014-0018548 A | 2/2014 |
| KR | 10-2014-0030551 A | 3/2014 |
| KR | 10-1453880 B1 | 10/2014 |
| KR | 10-2016-0149363 A | 12/2016 |
| KR | 10-2017-0026949 A | 3/2017 |
| KR | 10-2017-0088474 A | 8/2017 |
| KR | 10-2017-0141115 A | 12/2017 |
| KR | 10-2018-0003329 A | 1/2018 |
| KR | 10-2018-0005327 A | 1/2018 |
| KR | 10-2018-0014397 A | 2/2018 |
| KR | 10-2018-0028088 A | 3/2018 |
| KR | 10-2018-0076688 A | 7/2018 |

* cited by examiner

DISPLAY DEVICE AND METHOD OF MANUFACTURING DISPLAY DEVICE

CROSS-REFERENCE TO RELATED APPLICATIONS

This application is a continuation of U.S. patent application Ser. No. 17/295,776, filed May 20, 2021, which is a U.S. National Stage Patent Application of International Application No. PCT/KR2019/012321, filed Sep. 23, 2019, which claims priority to and the benefit of Korean Patent Application No. 10-2018-0158358, filed Dec. 10, 2018, the entire content of all of which is incorporated herein by reference.

TECHNICAL FIELD

The present disclosure herein relates to a display device with improved light efficiency and a method of manufacturing the display device with improved process reliability.

BACKGROUND ART

A display device may be classified into a self-light-emitting display device in which a light-emitting element emits light by itself, or a light-receiving display device which controls transmittance of received light. The self-light-emitting display device may be, for example, an organic light-emitting display device. Light generated in a light-emitting layer of the organic light-emitting display device may be emitted not only in a front direction but also in a lateral direction. Light efficiency may be determined based on the light emitted in the front direction. That is, light emitted in the lateral direction may cause a decrease in light efficiency.

DISCLOSURE OF THE INVENTION

Technical Problem

The present disclosure provides a display device with an improved light efficiency and a method of manufacturing the display device.

The present disclosure provides a method of manufacturing a display device with improved process reliability.

Technical Solution

Embodiments of the present invention provide display devices including: a display panel having a plurality of pixel regions; a first insulating layer on the display panel, having a first refractive index, and having a plurality of first openings defined in a region overlapping the plurality of pixel regions; a second insulating layer directly on the first insulating layer and having a plurality of second openings in a region corresponding to the plurality of first openings; and a third insulating layer covering the display panel, the first insulating layer, and the second insulating layer, and having a second refractive index higher than the first refractive index, wherein the third insulating layer may overlap the plurality of pixel regions on a plane.

In some embodiments, a first conductive layer on the display panel and a second conductive layer on the first conductive layer may be further included.

In other embodiments, an interlayer insulating layer between the first conductive layer and the second conductive layer may be further included, and the first insulating layer may be-on the second conductive layer.

In still other embodiments, the first insulating layer and the second insulating layer may be-between the first conductive layer and the second conductive layer.

In even other embodiments, the first conductive layer may include a connection portion; the second conductive layer may include sensor portions; the first insulating layer and the second insulating layer may have a touch contact hole defined therein; and the connection portion may be electrically connected to the sensor portions.

In yet other embodiments, each of the sensor portions may have a mesh shape and the sensor portions do not overlap the plurality of pixel regions on a plane.

In further embodiments, the third insulating layer may be on the second conductive layer to cover the second conductive layer.

In still further embodiments, the first insulating layer may include a first organic material, the second insulating layer may include an inorganic material, and the third insulating layer may include a second organic material.

In even further embodiments, each of the plurality of first openings and the plurality of second openings may be filled with the third insulating layer.

In yet further embodiments, the first insulating layer may be further defined to have a plurality of first auxiliary openings, and each of the plurality of first auxiliary openings may be defined to surround a corresponding first opening among the first openings.

In much further embodiments, the second insulating layer may be further defined to have a plurality of second auxiliary openings, and the plurality of second auxiliary openings may be defined in a region corresponding to the plurality of first auxiliary openings.

In still much further embodiments, a thickness of the first insulating layer may be greater than a thickness of the second insulating layer.

In even much further embodiments, the first refractive index is about 1.45 to about 1.55, and the second refractive index is about 1.60 to about 1.70.

In other embodiments of the present invention, methods for manufacturing a display panel include: forming a display panel including a plurality of pixel regions; forming, on the display panel, a first preliminary layer having a first refractive index; forming a second preliminary layer containing an inorganic material on the first preliminary layer; forming a mask by patterning the second preliminary layer; forming a first insulating layer by using the mask to pattern the first preliminary layer; and forming, on the mask, a cover layer having a second refractive index higher than the first refractive index.

In some embodiments, the forming of the display panel may include: disposing a base layer; disposing a circuit layer on the base layer; forming a light-emitting layer on the circuit layer; and forming an encapsulation layer on the light-emitting layer.

In other embodiments, the method may further include: forming a buffer layer on the encapsulation layer, forming a first conductive layer on the buffer layer, forming an interlayer insulating layer covering the first conductive layer, and forming a second conductive layer on the interlayer insulating layer may be further included, wherein the first preliminary layer may be on the second conductive layer.

In still other embodiments, the forming of the mask may include forming a plurality of mask openings in regions of the second preliminary layer which overlaps the plurality of pixel regions on a plane.

In even other embodiments, the forming of the mask may further include forming a plurality of auxiliary mask openings, which correspond one-to-one to and surround the plurality of mask openings.

In yet other embodiments, the first preliminary layer may include a first organic material, and the cover layer may include a second organic material.

In further embodiments, the method may further include: forming a buffer layer on the encapsulation layer, forming a first conductive layer on the buffer layer, and forming a second conductive layer on the first conductive layer may be further included, wherein the mask and the first insulating layer may be between the first conductive layer and the second conductive layer, and the cover layer may be on the second conductive layer.

Advantageous Effects

According to an embodiment of the present invention, the display device includes a low refractive layer having a plurality of openings defined therein, an inorganic layer on the low refractive layer, and a high refractive layer filling the plurality of openings. Light emitted from the light-emitting element of the display device may be refracted or totally reflected at the boundary between the low refractive layer and the high refractive layer, thus changing the path of light. The light output efficiency of the display device may be improved by the changed light path. In addition, the plurality of openings are provided by an etching process for which an inorganic layer is used as a mask, so a deviation in the inclinations of the plurality of openings may be reduced and patterning accuracy may be improved. Therefore, not only may a plurality of openings be easily provided even in a high-resolution display device, but also a dispersion of optical properties may be reduced, thus improving display quality.

DETAILED DESCRIPTION

Figure 1:
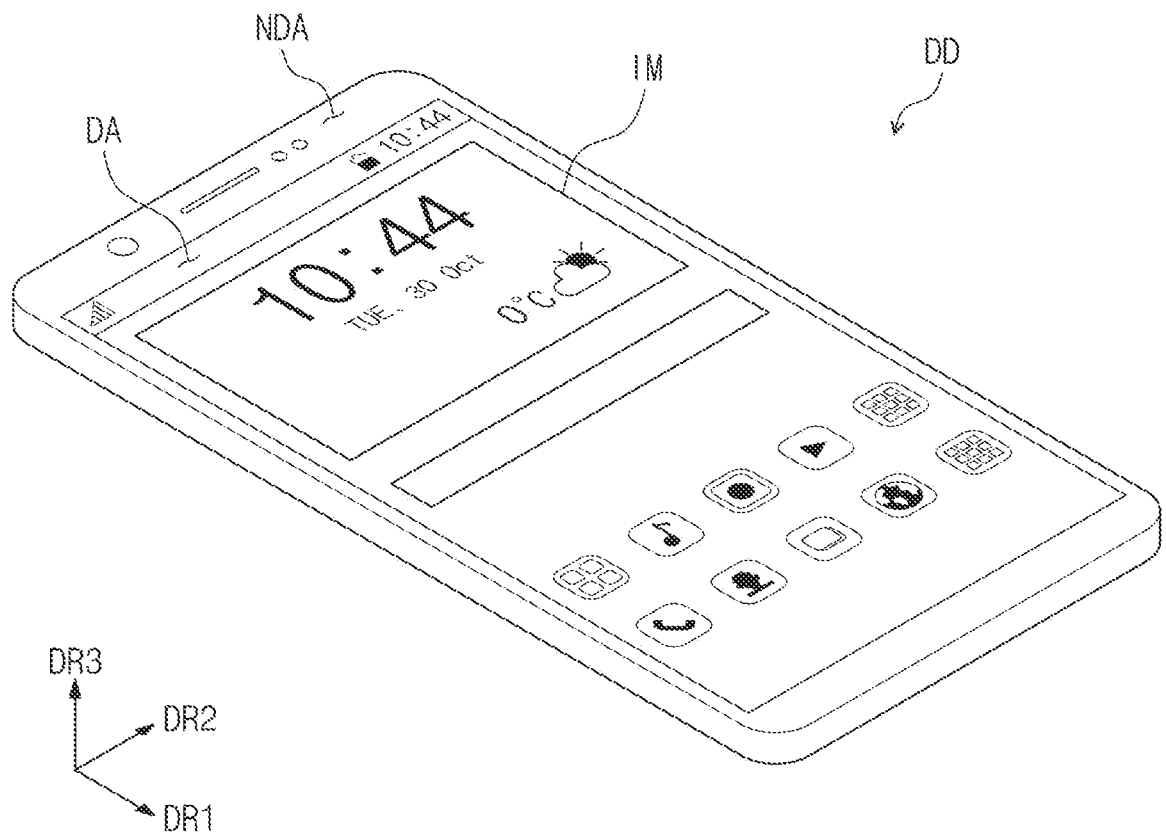
FIG. 1 is a perspective view of a display device according to an embodiment of the present invention.

In this specification, it will be understood that when an element (or a region, layer, portion, or the like) is referred to as being "on," "connected to," or "coupled to" another element, it can be directly on or directly connected or coupled to the other element, or a third element may be present therebetween.

Like reference numerals refer to like elements throughout. In addition, the thicknesses, ratios, and dimensions of elements in the drawings are exaggerated for effective description of the technical contents.

As used herein, the term "and/or" includes any and all combinations of one or more of the associated listed items.

The terms "first," "second" and the like may be used for describing various elements, but the elements should not be construed as being limited by the terms. Such terms are only used for distinguishing one element from other elements. For example, a first element could be termed a second element and vice versa without departing from the teachings of the disclosure. The terms of a singular form may include plural forms unless otherwise specified.

Furthermore, the terms "under," "lower side," "on," "upper side," and the like are used to describe association relationships among elements illustrated in the drawings. The terms, which are relative concepts, are described on the basis of directions illustrated in the drawings.

All of the terms used herein (including technical and scientific terms) have the same meanings as understood by those skilled in the art, unless otherwise defined. Terms in common usage such as those defined in commonly used dictionaries should be interpreted to contextually match the meanings in the relevant art, and are explicitly defined herein unless interpreted in an idealized or overly formal sense.

It will be further understood that the terms "include," "including," "has," "having," and the like, when used in this specification, specify the presence of stated features, numbers, steps, operations, elements, components, or combinations thereof, but do not preclude the presence or addition of one or more other features, numbers, steps, operations, elements, components, or combinations thereof.

Hereinafter, example embodiments of the present invention will be described with reference to the accompanying drawings.

FIG. 1 is a perspective view of a display device according to an embodiment of the present invention.

Referring to FIG. 1, the display device DD may be used for not only a large-sized electronic device such as a television, a monitor or an external billboard, but also a small- or medium-sized electronic device such as a personal computer, a laptop computer, a personal digital terminal, a vehicle navigation unit, a game machine, a portable electronic device and a camera. Besides, these are only presented as examples, and therefore, the display device may also be used for other electronic devices without departing from the concept of the present invention.

The display device DD may have a display region DA and a non-display region NDA defined therein.

The display region DA in which an image IM is displayed is parallel to a plane defined by a first direction DR1 and a second direction DR2. A direction normal to the display region DA, which is a thickness direction of the display device DD, is indicated by a third direction DR3. That is, a front surface (or upper surface) and a rear surface (lower surface) of each member are planes defined by the first direction DR1 and the second direction DR2, and the third direction DR3 is normal or perpendicular to the front surface and the rear surface. However, the directions indicated by the first to third directions DR1, DR2, and DR3 are relative concepts and therefore may be converted into different directions. Hereinafter, the first to third directions refer to the same reference numerals as the directions indicated by the first to third directions DR1, DR2, and DR3, respectively.

The non-display region NDA is a region which is adjacent to the display region DA and in which an image IM is not displayed. A bezel region of the display device DD may be defined by the non-display region NDA.

The non-display region NDA may surround the display region DA. However, without being limited thereto, a shape of the display region DA and a shape of the non-display region NDA may be a relative design.

FIGS. 2A to 2D are cross-sectional views of a display device DD according to an embodiment of the present invention. FIGS. 2A to 2D illustrate a cross section defined by the second direction DR2 and the third direction DR3. FIGS. 2A to 2D are simply illustrated to explain a stacking relationship of functional members constituting the display device DD.

The display device DD according to an embodiment of the present invention may include a display panel, an input detection sensor, an anti-reflector, and a window. At least some components among the display panel, the input detection sensor, the anti-reflector, and the window may be provided by a continuous process, or at least some components may be coupled to each other by an adhesive member. FIGS. 2A to 2D illustrate an optically clear adhesive member OCA as an example of an adhesive member. An adhesive member described hereinafter may include an ordinary adhesive or glue. According to an embodiment of the present invention, the anti-reflector and the window may be omitted or replaced with other components.

In FIGS. 2A to 2D, a corresponding configuration, formed through a continuous process together with other configurations, among the input detection sensor, the anti-reflector, and the window, is expressed as a "layer." A configuration combined by an adhesive member with other configurations among the input detection sensor, the anti-reflector, and the window is expressed as a "panel." The panel includes a base layer providing a base surface, such as a synthetic resin film, a composite material film, and a glass substrate, but the base layer may be omitted from the "layer." In other words, the units expressed as a "layer" are on the base surface provided by other units.

Hereinafter, depending on the presence or absence of a base layer, the input detection sensor, the anti-reflector, and the window may be referred to as an: input sensing panel ISP, a reflection prevention panel RPP, and a window panel WP; or an input sensing layer ISL, a reflection prevention layer RPL, and a window layer WL.

Figure 2A:
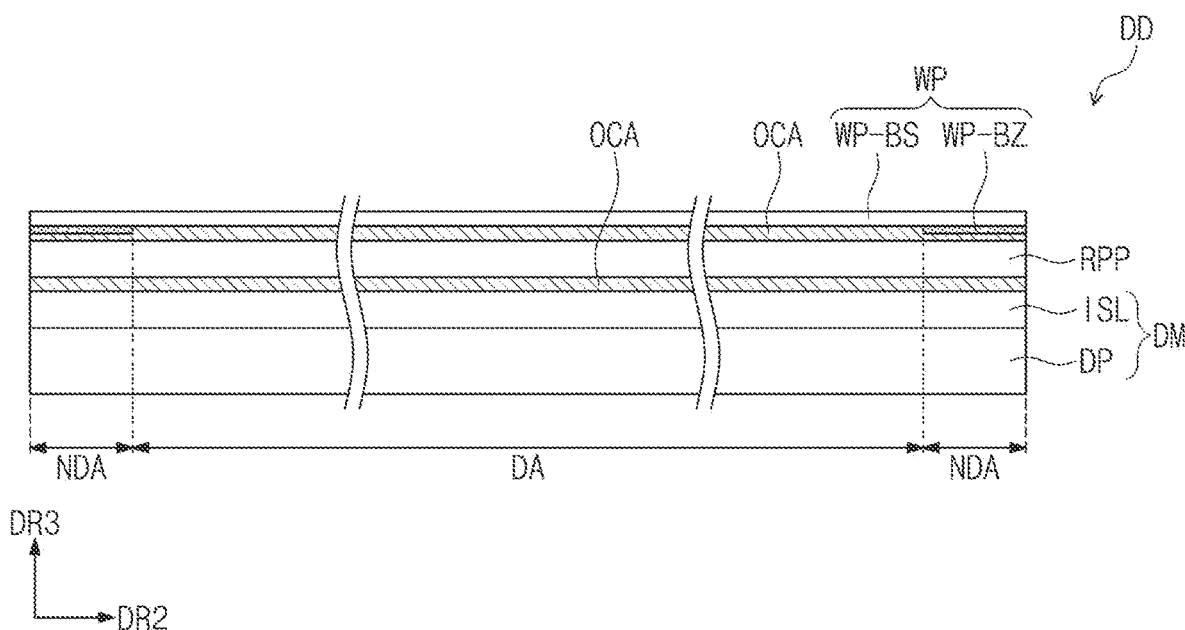
FIGS. 2A to 2D are cross-sectional views of a display device according to an embodiment of the present invention.

As illustrated in FIG. 2A, the display device DD may include a display panel DP, an input sensing layer ISL, a reflection prevention panel RPP, and a window panel WP. The input sensing layer ISL is directly on the display panel DP. In this specification, the words "configuration B is directly on configuration A," means that there is no separate adhesive layer and/or member between configuration A and configuration B. Configuration B is formed through a continuous process on the base surface provided by configuration A after configuration A has been provided.

A combination of the display panel DP and the input sensing layer ISL directly on the display panel DP may be defined as a display module DM. An optically clear adhesive member OCA is between the display module DM and the reflection prevention panel RPP and between the reflection prevention panel RPP and the window panel WP, respectively.

The display panel DP displays an image. The input sensing layer ISL obtains coordinate information of an external input (e.g., a touch event). Although not illustrated separately, the display module DM according to an embodiment of the present invention may further include a protective member on a lower surface of the display panel DP. The protective member and the display panel DP may be coupled to each other by an adhesive member. Display devices DD of FIGS. 2B to 2D explained hereinafter may also further include a protective member.

The display panel DP according to an embodiment of the present invention may be a light-emitting display panel, and is not particularly limited thereto. For example, the display panel DP may be an organic light-emitting display panel or a quantum dot light-emitting display panel. A light-emitting layer of the organic light-emitting display panel may contain an organic light-emitting material. A light-emitting layer of the quantum dot light-emitting display panel may include quantum dots, quantum rods, and the like. Hereinafter, the display panel DP will be described as an organic light-emitting display panel.

The reflection prevention panel RPP reduces reflectivity of external light that is incident from an upper surface of the window panel WP. The reflection prevention panel RPP according to an embodiment of the present invention may include a retarder and a polarizer. The retarder may be a film-type retarder or a liquid crystal coated retarder and includes a λ/2 retarder and/or a λ/4 retarder. The polarizer may also be a film-type polarizer or a liquid crystal coated polarizer. The film type may include an elongation synthetic resin film, and the liquid crystal coated type may include liquid crystals arranged in a predetermined arrangement. The retarder and the polarizer may further include a protective film. The retarder and the polarizer themselves or the protective film may be defined as a base layer of the reflection prevention panel RPP.

The reflection prevention panel RPP according to an embodiment of the present invention may include color filters. The color filters have a predetermined arrangement. The arrangement of the color filters may be determined taking into account light-emitting colors of pixels included in the display panel DP. The reflection prevention panel RPP may further include a black matrix adjacent to the color filters.

The reflection prevention panel RPP according to an embodiment of the present invention may include a destructive interference structure. For example, the destructive interference structure may include a first reflective layer and a second reflective layer which are on respective different layers. First reflective light and second reflective light, which are respectively reflected by the first reflective layer and the second reflective layer, destructively interfere with each other, thus reducing the reflectivity of external light.

The window panel WP according to an embodiment of the present invention includes a base layer WP-BS and a light-shielding pattern WP-BZ. The base layer WP-BS may include a glass substrate and/or a synthetic resin film. The base layer WP-BS is not limited to a single layer structure. The base layer WP-BS may include two or more films combined with each other by an adhesive member.

The light-shielding pattern WP-BZ partially overlaps the base layer WP-BS. The light shielding pattern WP-BZ may be on a rear surface of the base layer WP-BS, and substantially define a non-display region NDA of the display device DD. A region in which the light-shielding pattern WP-BZ is not located may define the display region DA of the display device DD. When limited to the window panel WP, the region in which the light-shielding pattern WP-BZ is located is defined as a light-shielding region, and the region in which the light-shielding pattern WP-BZ is not located is defined as a transmission region of the window panel WP.

Figure 2B:
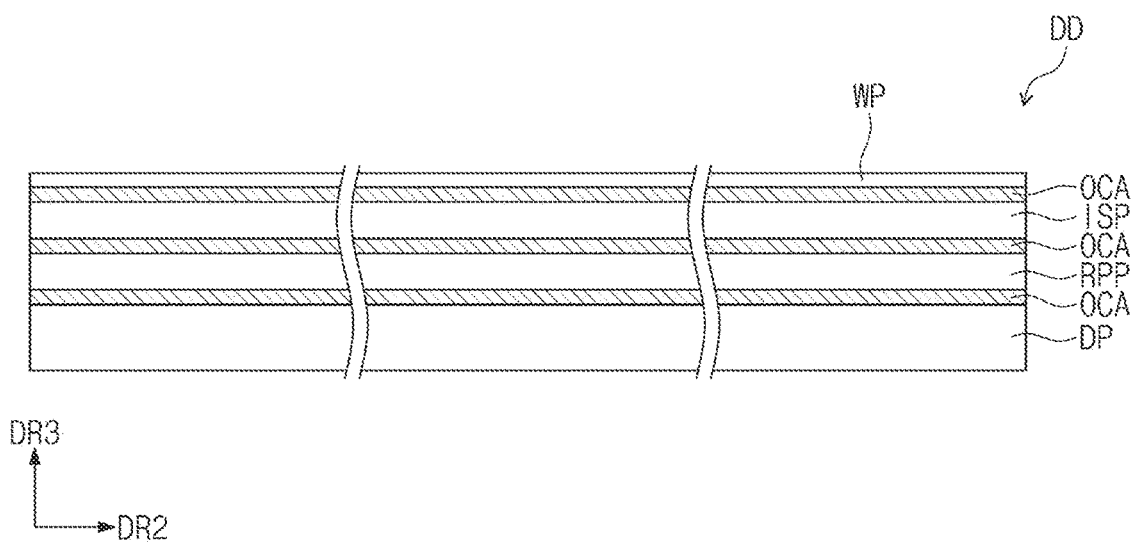
Figure 2C:
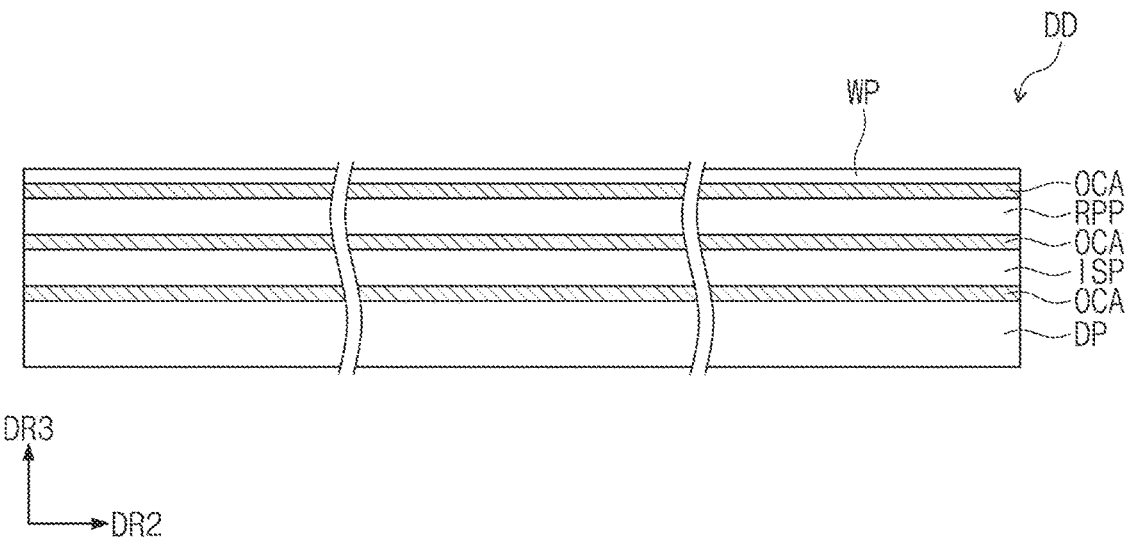
Figure 2D:
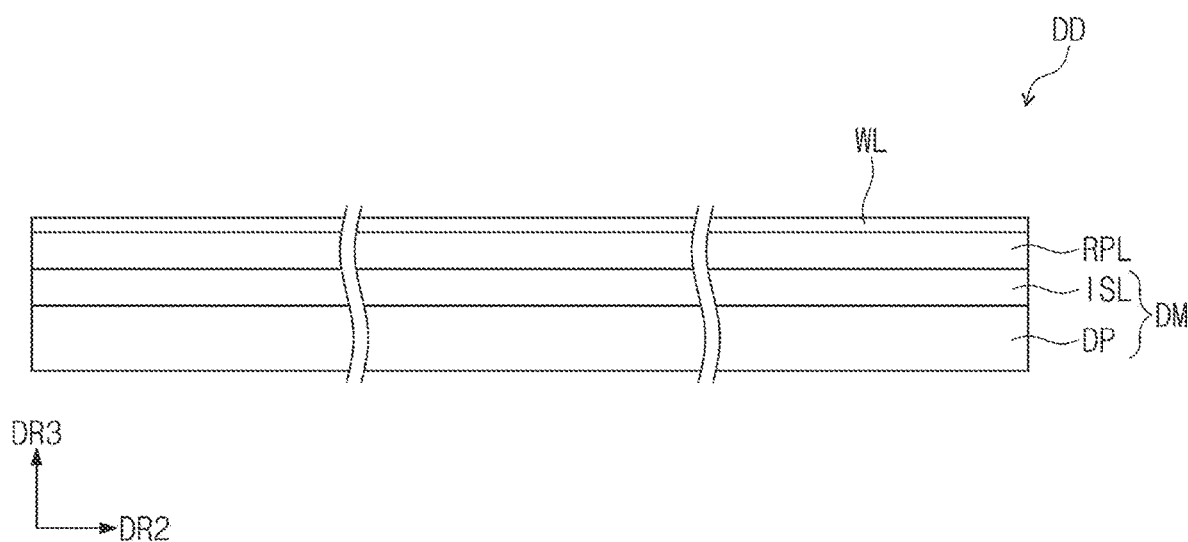

The light-shielding pattern WP-BZ may have a multi-layer structure. The multi-layer structure may include a colored layer and a black light-shielding layer. The colored layer and the black light-shielding layer may be provided through deposition, printing, and coating processes. Although not illustrated separately, the window panel WP may further include a functional coating layer on the front surface of the base layer WP-BS. The functional coating layer may include a fingerprint prevention layer, a reflection prevention layer, a hard coating layer, and the like. In FIGS. 2B to 2D referenced below, the window panel WP and the window layer WL are briefly illustrated without being divided into the base layer WP-BS and the light-shielding pattern WP-BZ.

As illustrated in FIGS. 2B and 2C, the display device DD may include a display panel DP, an input sensing panel ISP, a reflection prevention panel RPP, and a window panel WP. A stacking order of the input sensing panel ISP and the reflection prevention panel RPP may be changed.

As illustrated in FIG. 2D, the display device DD may include a display panel DP, an input sensing layer ISL, a reflection prevention layer RPL, and a window layer WL. The optically clear adhesive members are omitted in comparison with the display device DD illustrated in FIG. 2A, and the input sensing layer ISL, the reflection prevention layer RPL, and the window layer WL are provided through a continuous process on a base surface provided by the display panel DP. A stacking order of the input sensing layer ISL and the reflection prevention layer RPL may be changed.

Figure 3:
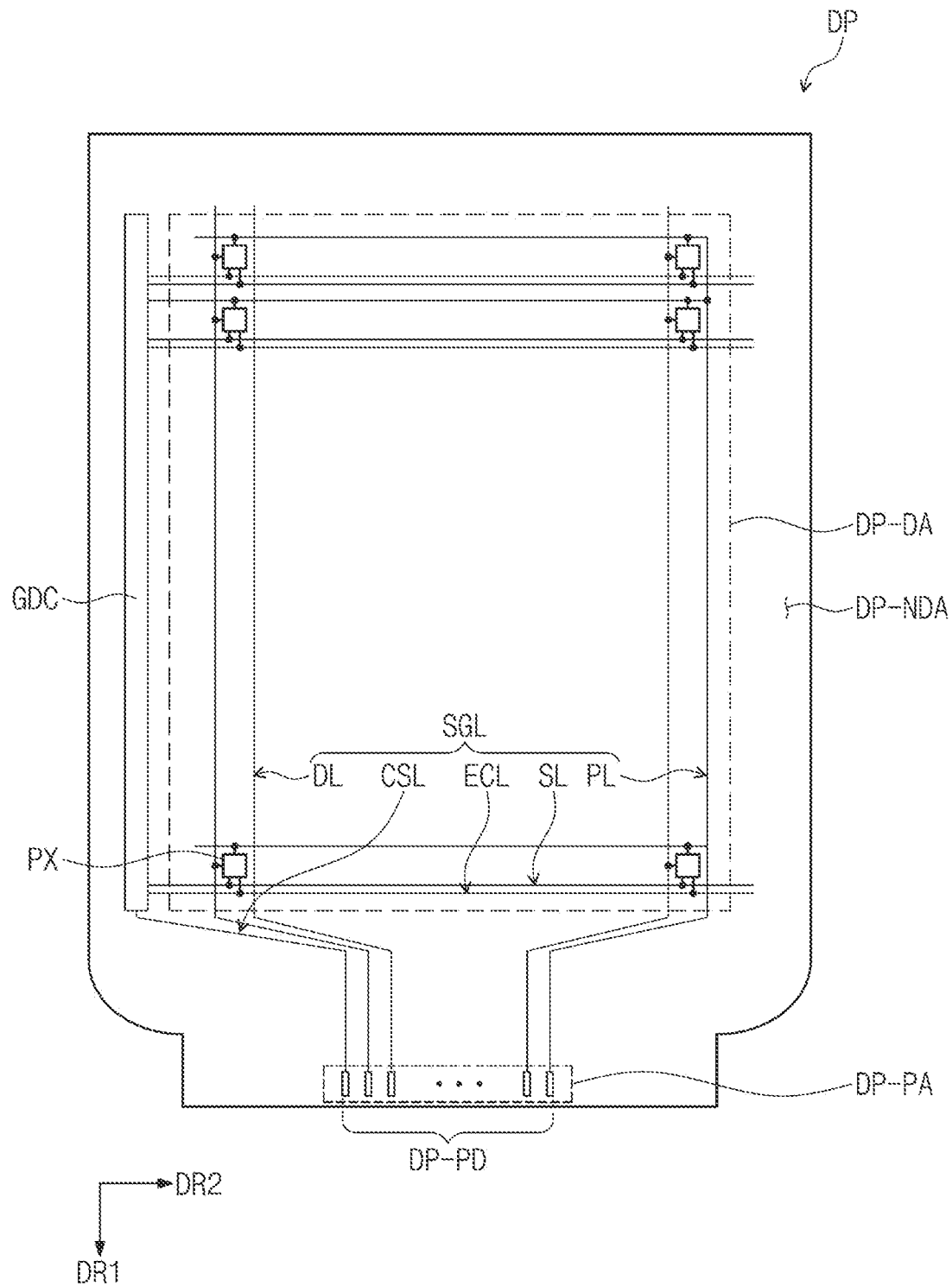
FIG. 3 is a plan view of a display panel according to an embodiment of the present invention.

FIG. 3 is a plan view of a display panel according to an embodiment of the present invention.

Referring to FIG. 3, the display panel DP may include a driving circuit GDC, a plurality of signal lines SGL (hereinafter referred to as signal lines), a plurality of signal pads DP-PD (hereinafter referred to as signal pads), and a plurality of pixels PX (hereinafter referred to as pixels).

The display region DP-DA may be defined as a region in which the pixels PX are located. Each of the pixels PX includes an organic light-emitting diode and a pixel driving circuit connected thereto. The driving circuit GDC, the signal lines SGL, the signal pads DP-PD, and the pixel driving circuit may be included in a circuit layer ML illustrated in FIG. 5.

The driving circuit GDC may include a scan driving circuit. The scan driving circuit generates a plurality of scan signals (hereinafter referred to as scan signals), and sequentially outputs the scan signals to a plurality of scan lines SL (hereinafter referred to as scan lines), which will be described below. The scan driving circuit may further output another control signal to the driving circuit of the pixels PX.

The scan driving circuit may include a plurality of thin film transistors provided through the same process as a process for forming the driving circuit of the pixels PX, for example, a low-temperature polycrystalline silicon (LTPS) process or a low-temperature polycrystalline oxide (LTPO) process.

The signal lines SGL include scan lines SL, data lines DL, a power line PL, light-emitting control lines ECL, and a control signal line CSL.

Each of the scan lines SL is connected to a corresponding pixel PX among pixels PX, and each of the data lines DL is connected to a corresponding pixel PX among pixels PX. The power line PL is connected to pixels PX. Each of the light-emitting control lines ECL is connected to a corresponding pixel PX among pixels PX. The control signal line CSL may provide control signals to the scan driving circuit.

The signal lines SGL overlap the display region DP-DA and the non-display region DP-NDA. The signal lines SGL may include a pad portion and a line portion. The line portion overlaps the display region DP-DA and the non-display region DP-NDA. The pad portion is located at the end of the line portion. The pad portion is located in the non-display region DP-NDA and overlaps a corresponding signal pad among the signal pads DP-PD. A region in which the signal pads DP-PD are located in the non-display region DP-NDA may be defined as a pad region DP-PA. A circuit substrate which is not illustrated may be connected to the pad region DP-PA.

Figure 4:
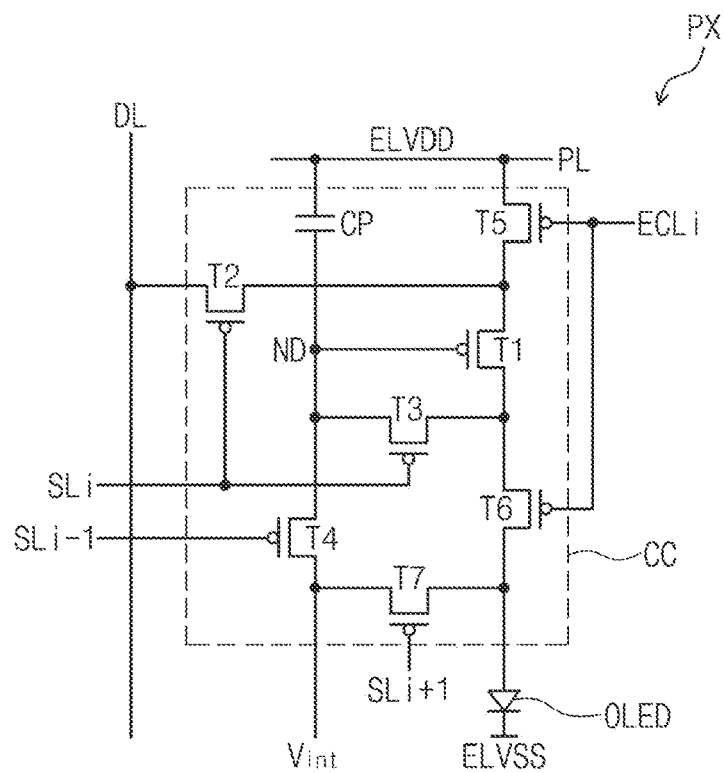
FIG. 4 is an equivalent circuit diagram of a pixel according to an embodiment of the present invention.

FIG. 4 is an equivalent circuit diagram of a pixel PX according to an embodiment of the present invention. FIG. 4 illustrates, as an example, a pixel PX connected to an i-th scan line SLi and an i-th light-emitting control line ECLi.

The pixel PX may include an organic light-emitting diode OLED and a pixel circuit CC. The pixel circuit CC may include a plurality of transistors T1-T7 and a capacitor CP. The pixel circuit CC controls the amount of current flowing through the organic light-emitting diode OLED in response to a data signal.

The organic light-emitting diode OLED may emit light having a predetermined brightness in response to the amount of current supplied from the pixel circuit CC. To this end, the level of a first power supply ELVDD may be set higher than the level of a second power supply ELVSS.

Each of the plurality of transistors T1-T7 may include an input electrode (or a source electrode), an output electrode (or a drain electrode), and a control electrode (or a gate electrode). In this specification, for convenience, one of the input electrode and the output electrode may be referred to as a first electrode, and the other electrode may be referred to as a second electrode.

The first electrode of the first transistor T1 is connected to the first power supply ELVDD via the fifth transistor T5, and the second electrode of the first transistor T1 is connected to the anode electrode of the organic light-emitting diode OLED via the sixth transistor T6. In this specification, the first transistor T1 may be referred to as a driving transistor.

The first transistor T1 controls the amount of current flowing through the organic light-emitting diode OLED in response to a voltage applied to the control electrode of the first transistor T1.

The second transistor T2 is connected between the data line DL and the first electrode of the first transistor T1, and the control electrode of the second transistor T2 is connected to the i-th scan line SLi. The second transistor T2 is turned on when the i-th scan signal is provided to the i-th scan line SLi, thus electrically connecting the data line DL to the first electrode of the first transistor T1.

The third transistor T3 is connected between the second electrode of the first transistor T1 and the control electrode of the first transistor T1. The control electrode of the third transistor T3 is connected to the i-th scan line SLi. The third transistor T3 is turned on when the i-th scan signal is provided to the i-th scan line SLi, thus electrically connecting the second electrode of the first transistor T1 to the control electrode of the first transistor T1. Therefore, when the third transistor T3 is turned on, the first transistor T1 is connected in the form of a diode.

The fourth transistor T4 is connected between a node ND and an initialization power generation unit (not illustrated), and the control electrode of the fourth transistor T4 is connected to an (i−1)th scan line SLi−1. The fourth transistor T4 is turned on when an (i−1)th scan signal is provided to the (i−1)th scan line SLi−1, thus supplying an initialization voltage Vint to the node ND.

The fifth transistor T5 is connected between the power line PL and the first electrode of the first transistor T1. The control electrode of the fifth transistor T5 is connected to the i-th light-emitting control line ECLi.

The sixth transistor T6 is connected between the second electrode of the first transistor T1 and the anode electrode of the organic light-emitting diode OLED, and the control electrode of the sixth transistor T6 is connected to the i-th light-emitting control line ECLi.

The seventh transistor T7 is connected between the initialization power generation unit (not illustrated) and the anode electrode of the organic light-emitting diode OLED. The control electrode of the seventh transistor T7 is connected to an (i+1)th scan line SLi+1. The seventh transistor T7 is turned on when the (i+1)th scan signal is provided to the (i+1)th scan line SLi+1, thus supplying the initialization voltage Vint to the anode electrode of the organic light-emitting diode OLED.

The seventh transistor T7 may improve a black expression ability of the pixel PX. Specifically, when the seventh transistor T7 is turned on, a parasitic capacitor (not illustrated) of the organic light-emitting diode OLED is discharged. Thus, when black luminance is implemented, the organic light-emitting diode OLED may not emit light due to leakage current from the first transistor T1 and therefore, the black expression ability may be improved.

Additionally, although FIG. 4 illustrates that the control electrode of the seventh transistor T7 is connected to the (i+1)th scan line SLi+1, the present invention is not limited thereto. In another embodiment of the present invention, the control electrode of the seventh transistor T7 may be connected to the i-th scan line SLi or the (i−1)th scan line SLi−1.

FIG. 4 illustrates a p-type metal-oxide-semiconductor (PMOS) for reference, but the present invention is not limited thereto. In an alternative embodiment of the present invention, the pixel circuit CC may be constituted of an n-type metal-oxide-semiconductor (NMOS). In still another embodiment of the present invention, the pixel circuit CC may be constituted of a combination of NMOS and PMOS.

The capacitor CP is between the power line PL and the node ND. The capacitor CP stores a voltage corresponding to a data signal. When the fifth transistor T5 and the sixth transistor T6 are turned on, the amount of current flowing through the first transistor T1 may be determined according to a voltage stored in the capacitor CP.

In the present invention, an equivalent circuit of the pixel PX is not limited to the equivalent circuit illustrated in FIG. 4. In another embodiment of the present invention, the pixel PX may be implemented in various forms that allow the organic light-emitting diode OLED to emit light.

Figure 5:
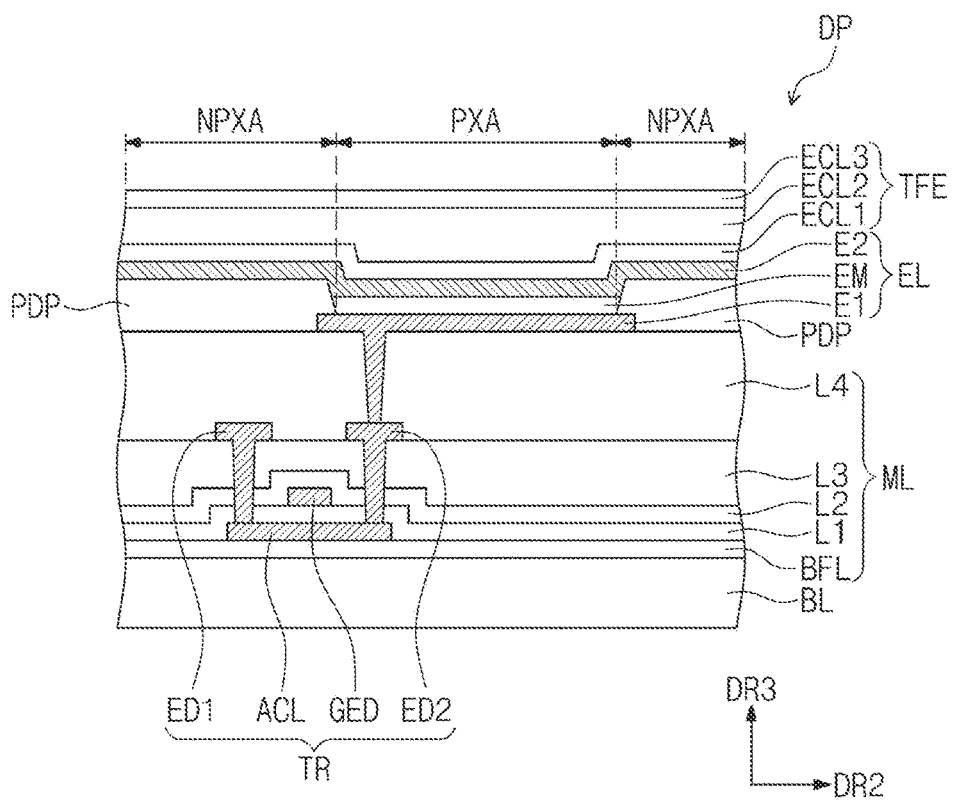
FIG. 5 is a partial cross-sectional view illustrating a configuration of a display panel according to an embodiment of the present invention.

FIG. 5 is a cross-sectional view illustrating a partial configuration of a display panel according to an embodiment of the present invention.

Referring to FIG. 5, the display panel DP may include a base layer BL, a circuit layer ML, a light-emitting element layer EL, and an encapsulation layer TFE. The circuit layer ML may include a transistor TR and a plurality of insulating layers BFL, L1, L2, L3, and L4.

The insulating layer BFL may be on the base layer BL, and the transistor TR may be on the insulating layer BFL. The transistor TR of FIG. 5 may be the first transistor T1 illustrated in FIG. 4. The transistor TR may include a semiconductor layer ACL, a control electrode GED, a first electrode ED1, and a second electrode ED2.

The semiconductor layer ACL may be on the insulating layer BFL. The insulating layer BFL may be a buffer layer which provides a modified surface to the semiconductor layer ACL. In this case, the semiconductor layer ACL may have higher adhesion to the insulating layer BFL than the base layer BL. In addition, the insulating layer BFL may be a barrier layer which protects the lower surface of the semiconductor layer ACL. In this case, the insulating layer BFL may block contamination or moisture which passes through the base layer BL or the base layer BL itself from penetrating into the semiconductor layer ACL. Alternatively, the insulating layer BFL may be a light-blocking layer which blocks external light incident through the base layer BL from entering the semiconductor layer ACL. In this case, the insulating layer BFL may further contain a light-shielding material.

The semiconductor layer ACL may contain polysilicon or amorphous silicon. In addition, the semiconductor layer ACL may contain a metal oxide semiconductor. The semiconductor layer ACL may include: a channel region serving as a passage through which electrons or holes may move; and a first ion-doped region and a second ion-doped region, which are located with the channel region interposed therebetween.

The first insulating layer L1 is on the insulating layer BFL and may cover the semiconductor layer ACL. The first insulating layer L1 may contain an inorganic material. The inorganic material may contain at least one of silicon nitride, silicon oxy nitride, silicon oxide, titanium oxide, or aluminum oxide.

The control electrode GED may be on the first insulating layer L1. The second insulating layer L2 is on the first insulating layer L1 and may cover the control electrode GED. The second insulating layer L2 may contain an inorganic material.

The third insulating layer L3 may be on the second insulating layer L2. The first electrode ED1 and the second electrode ED2 may be on the third insulating layer L3. The first electrode ED1 and the second electrode ED2 may be connected to the semiconductor layer ACL through throughholes which penetrate the first insulating layer L1, the second insulating layer L2, and the third insulating layer L3.

The fourth insulating layer L4 is on the third insulating layer L3 and may cover the first electrode ED1 and the second electrode ED2. The fourth insulating layer L4 may be composed of a single layer or a plurality of layers. For example, the single layer may include an organic layer. The plurality of layers may be provided by stacking an organic layer and an inorganic layer. The fourth insulating layer L4 may be a planarization layer that provides a flat surface on the top thereof.

The light-emitting element layer EL and definition patterns PDP may be on the fourth insulating layer L4.

The light-emitting element layer EL may include a first electrode E1, a light-emitting layer EM, and a second electrode E2. The first electrode E1 is on the fourth insulating layer L4 and may be electrically connected to the second electrode ED2 through a through-hole defined in the fourth insulating layer L4. The light-emitting element layer EL may correspond to the organic light-emitting diode OLED described in FIG. 4.

The definition patterns PDP may be on the circuit layer ML and define a pixel region PXA. The definition patterns PDP cover at least a portion of the first electrode E1 and may be on the fourth insulating layer L4. A portion of the first electrode E1 may not be covered by the definition patterns PDP, and the portion may correspond to the pixel region PXA. Accordingly, the definition patterns PDP may be referred to as pixel definition patterns or pixel definition film.

The light-emitting layer EM may be between the first electrode E1 and the second electrode E2. The light-emitting layer EM may have a single layer structure made of a single material, a single layer structure made of a plurality of different materials, or a multi-layer structure composed of a plurality of layers made of a plurality of different materials.

The light-emitting layer EM may contain an organic material. The organic material is not particularly limited as long as it is a commonly used material. For example, the light-emitting layer EM may be composed of at least one material emitting red, green, or blue colors, and may contain a fluorescent material or a phosphorescent material.

The second electrode E2 may be on the light-emitting layer EM and the definition patterns PDP. The second electrode E2 may receive the second power supply ELVSS (see FIG. 4).

An encapsulation layer TFE is on the second electrode E2. The encapsulation layer TFE may directly cover the second electrode E2. In another embodiment of the present invention, a capping layer covering the second electrode E2 may be further between the encapsulation layer TFE and the second electrode E2. In this case, the encapsulation layer TFE may directly cover the capping layer. The capping layer may contain an organic material. The capping layer protects the second electrode E2 from a subsequent process, such as a sputtering process, and improves the light output efficiency of the light-emitting element layer EL. The capping layer may have a higher refractive index than a first inorganic layer ECL1, as described later.

The encapsulation layer TFE may include a first inorganic layer ECL1, an organic layer ECL2, and a second inorganic layer ECL3, which are sequentially stacked. The organic layer ECL2 may be between the first inorganic layer ECL1 and the second inorganic layer ECL3. The first inorganic layer ECL1 and the second inorganic layer ECL3 may be provided by depositing an inorganic material, and the organic layer ECL2 may be provided by depositing, printing, or coating an organic material.

The first inorganic layer ECL1 and the second inorganic layer ECL3 protect the light-emitting element layer EL from moisture and oxygen, and the organic layer ECL2 protects the light-emitting element layer EL from a foreign substance such as a dust particle. The first inorganic layer ECL1 and the second inorganic layer ECL3 may include at least one of silicon nitride, silicon oxynitride, silicon oxide, titanium oxide, or aluminum oxide. The organic layer ECL2 may include a polymer, for example, an acrylic-based organic layer. However, these are examples and the present invention is not limited thereto.

Although FIG. 5 illustrates that the encapsulation layer TFE includes two inorganic layers and one organic layer, the present invention is not limited thereto. For example, the encapsulation layer TFE may include three inorganic layers and two organic layers, and in this case, the inorganic layer and the organic layer may have an alternatingly stacked structure.

Figure 6:
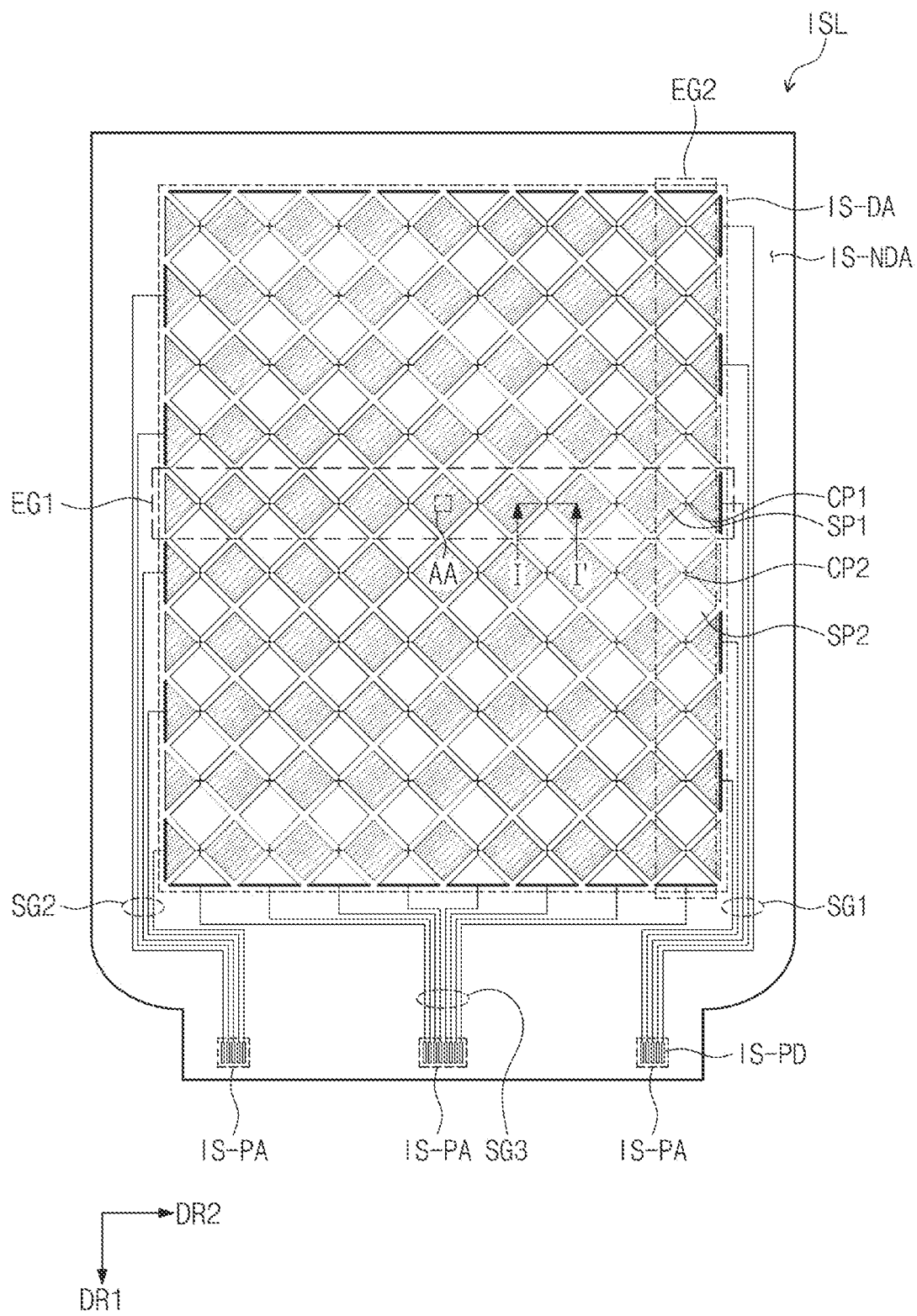
FIG. 6 is a plan view of an input sensing layer according to an embodiment of the present invention.

FIG. 6 is a plan view of an input sensing layer according to an embodiment of the present invention. The input sensing layer ISL described below may be equally applied to the input sensing panel ISP (see FIG. 2B)

The input sensing layer ISL may include a sensing region IS-DA corresponding to the display region DP-DA of the display panel DP illustrated in FIG. 3 and a line region IS-NDA corresponding to the non-display region DP-NDA.

The input sensing layer ISL may include: first sensing electrodes EG1, second sensing electrodes EG2, a first signal line group SG1 electrically connected to some corresponding electrodes among the first sensing electrodes EG1; a second signal line group SG2 electrically connected to the other corresponding electrodes among the first sensing electrodes EG1; and a third signal line group SG3 electrically connected to the second sensing electrodes EG2.

FIG. 6 illustrates that the first signal line group SG1 and the second signal line group SG2 are located with the sensing region IS-DA interposed therebetween. However, in an embodiment of the present invention, the first signal line group SG1 and the second signal line group SG2 may be on a same side of the sensing region IS-DA. In addition, in an embodiment of the present invention, each of the first signal line group SG1 and the second signal line group SG2 may be connected to the first sensing electrodes EG1 in a double routing structure.

The first sensing electrodes EG1 and the second sensing electrodes EG2 are in the sensing region IS-DA. The first signal line group SG1, the second signal line group SG2, and the third signal line group SG3 are in the line region IS-NDA.

In this embodiment, the input sensing layer ISL may be a capacitive touch sensor that senses an external input according to a mutual capacitance method. One of the first sensing electrodes EG1 and the second sensing electrodes EG2 receives a detection signal, and the other sensing electrode (the first sensing electrode EG1 or the second sensing electrode EG2) outputs as an output signal, the amount of change between the first sensing electrodes EG1 and the second sensing electrodes EG2.

Each of the first sensing electrodes EG1 extends along the second direction DR2. The first sensing electrodes EG1 are spaced apart in the first direction DR1. Each of the second sensing electrodes EG2 extends along the first direction DR1. The second sensing electrodes EG2 are spaced apart in the second direction DR2.

The first sensing electrodes EG1 may include first sensor portions SP1 and first connection portions CP1. The first sensor portions SP1 are arranged along the second direction DR2. Each of the first connection portions CP1 may connect two adjacent first sensor portions SP1 among the first sensor portions SP1.

The second sensing electrodes EG2 may include second sensor portions SP2 and second connection portions CP2. The second sensor portions SP2 are arranged along the first direction DR1. Each of the second connection portions CP2 may connect two adjacent second sensor portions SP2 among the second sensor portions SP2.

The first signal line group SG1, the second signal line group SG2, and the third signal line group SG3 may be electrically connected to corresponding signal pads IS-PD. A region in which the signal pads IS-PD are located in the line region IS-NDA may be defined as a pad region IS-PA. A circuit board (not illustrated) may be connected to the pad region IS-PA.

Figure 7:
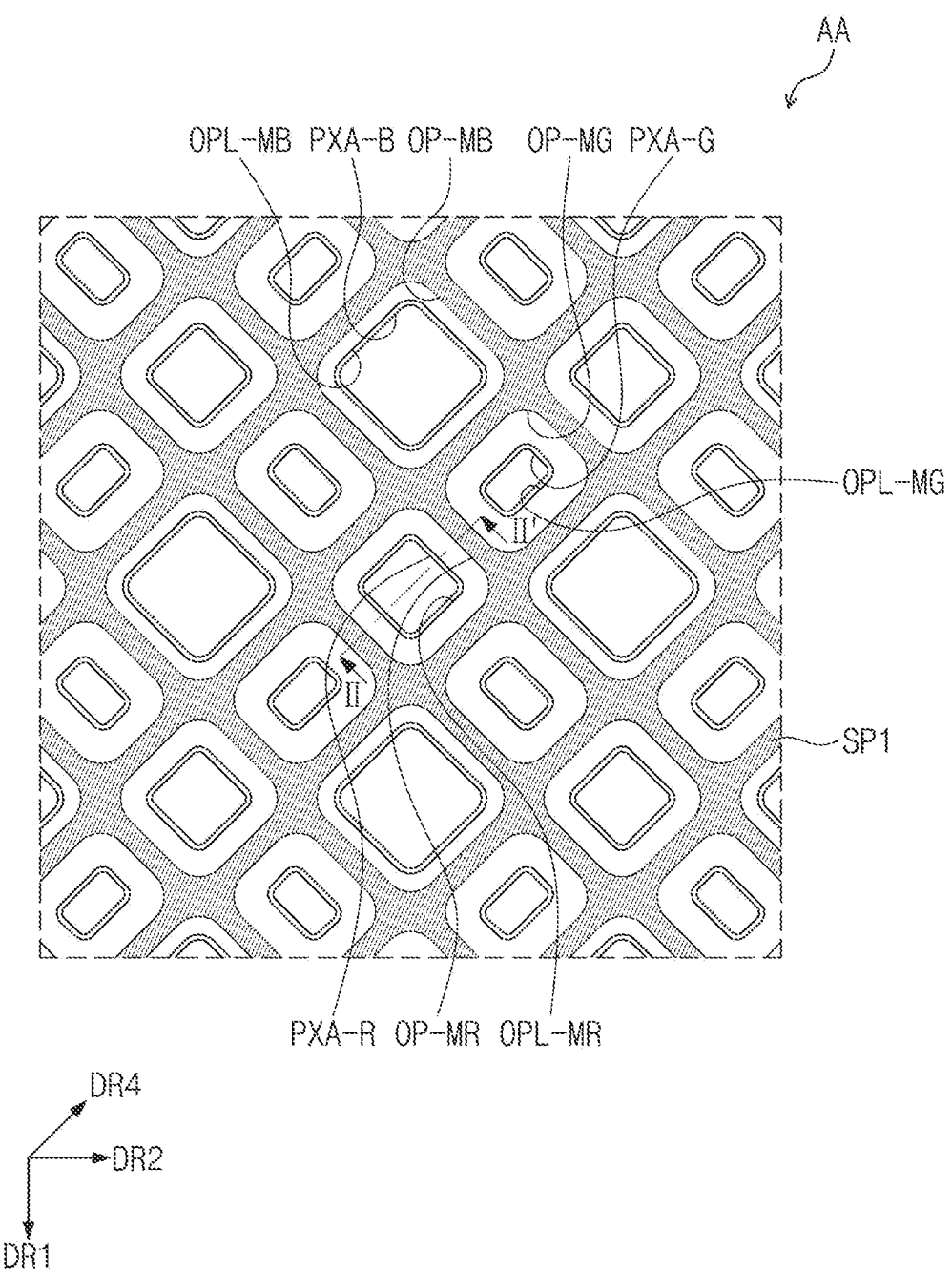
FIG. 7 is an enlarged plan view illustrating the region AA of FIG. 6.

FIG. 7 is an enlarged plan view illustrating the region CAA' of FIG. 6. An arrangement relationship among a first pixel region PXA-R, a second pixel region PXA-B, and a third pixel region PXA-G of the display panel DP (see FIG. 5) is illustrated. The first pixel region PXA-R, the second pixel region PXA-B, and the third pixel region PXA-G are defined as the pixel region PXA described with reference to FIG. 5.

Referring to FIGS. 6 and 7, in this embodiment, the first pixel region PXA-R, the second pixel region PXA-B, and the third pixel region PXA-G may have different areas. The first pixel region PXA-R may have a first area, the second pixel region PXA-B may have a second area, and the third pixel region PXA-G may have a third area. The second area may be larger than the first area, and the first area may be larger than the third area.

The plurality of pixels PX described with reference to FIG. 3 may include a red pixel generating red light, a blue pixel generating blue light, and a green pixel generating green light. In this embodiment, the first pixel region PXA-R may correspond to the red pixel, the second pixel region PXA-B may correspond to the blue pixel, and the third pixel region PXA-G may correspond to the green pixel.

The first pixel region PXA-R and the second pixel region PXA-B may be alternatingly arranged along the first direction DR1 and the second direction DR2. The third pixel region PXA-G may be provided in plurality, and the plurality of third pixel regions PXA-G may be arranged along the first direction DR1 and the second direction DR2. The first pixel region PXA-R and the third pixel region PXA-G may be alternatingly arranged along the fourth direction DR4. The second pixel region PXA-B and the third pixel region PXA-G may be alternatingly arranged along the fourth direction DR4. The fourth direction DR4 may be referred to as a diagonal direction crossing the first direction DR1 and the second direction DR2.

Although FIG. 7 illustrates, as an example, that the first pixel region PXA-R, the second pixel region PXA-B, and the third pixel region PXA-G are arranged in the form of matrix structure (e.g., an RGBG matrix, a PENTILE® matrix, etc.), the present invention is not limited thereto. For example, the first pixel region PXA-R, the second pixel region PXA-B, and the third pixel region PXA-G may be arranged in a stripe form. The stripe form may mean that the first pixel region PXA-R, the second pixel region PXA-B, and the third pixel region PXA-G are alternately arranged along the second direction DR2, and that same pixel regions are arranged in the first direction DR1.

Each of the first sensor portions SP1 and the second sensor portions SP2 may have a mesh shape. A plurality of openings OP-MR, OP-MG, and OP-MB may be defined in each of the first sensor portions SP1 and the second sensor portions SP2. Accordingly, on a plane, the first sensor portions SP1 and the second sensor portions SP2 do not overlap the first pixel region PXA-R, the second pixel region PXA-B, and the third pixel region PXA-G. For example, the first openings OP-MR may be defined in regions corresponding to the first pixel region PXA-R, the second openings OP-MB may be defined in regions corresponding to the second pixel region PXA-B, and the third openings OP-MG may be defined in regions corresponding to the third pixel region PXA-G.

Figure 8:
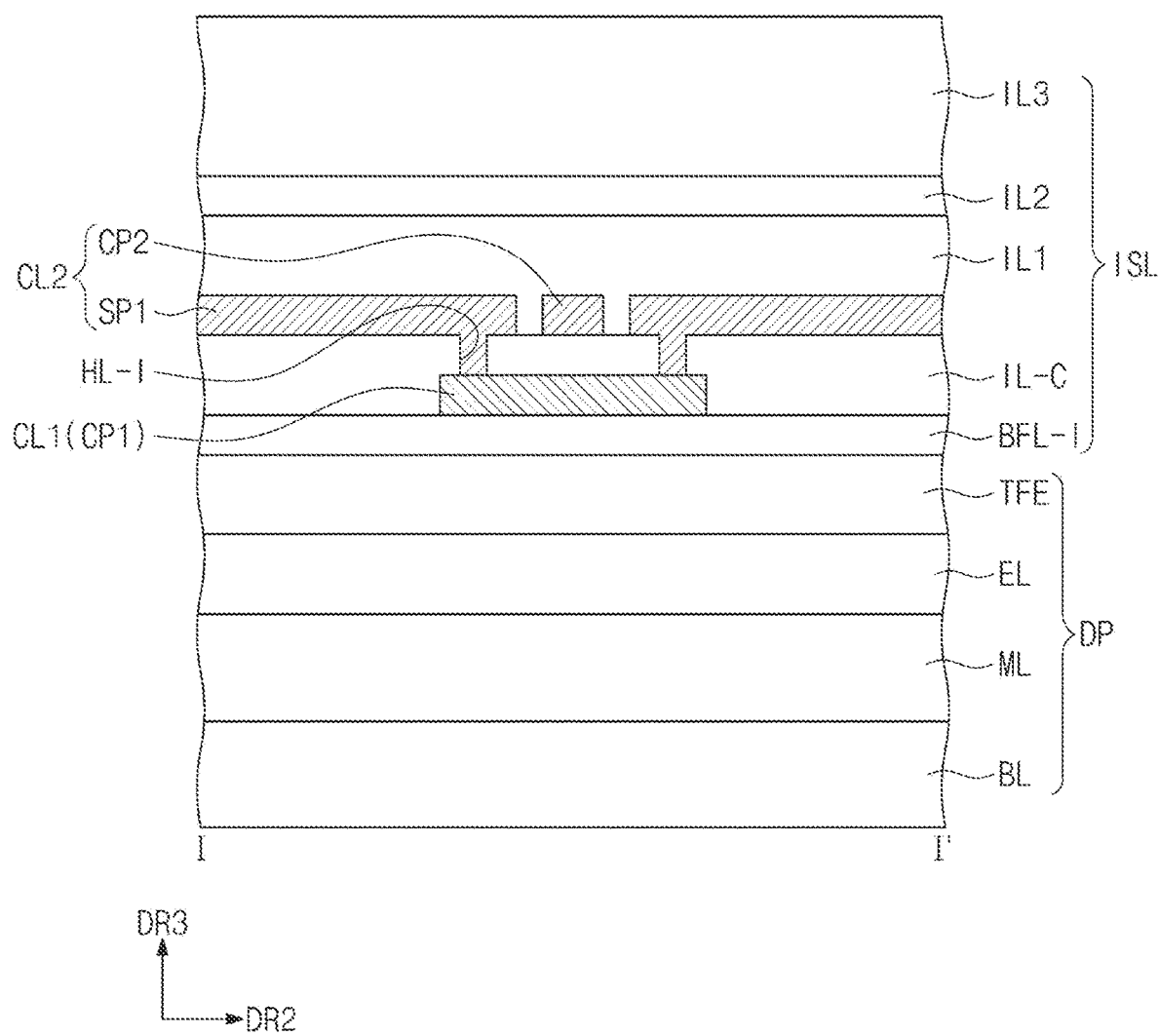
FIG. 8 is a cross-sectional view illustrating a portion taken along the line I-I' of FIG. 6.
Figure 9:
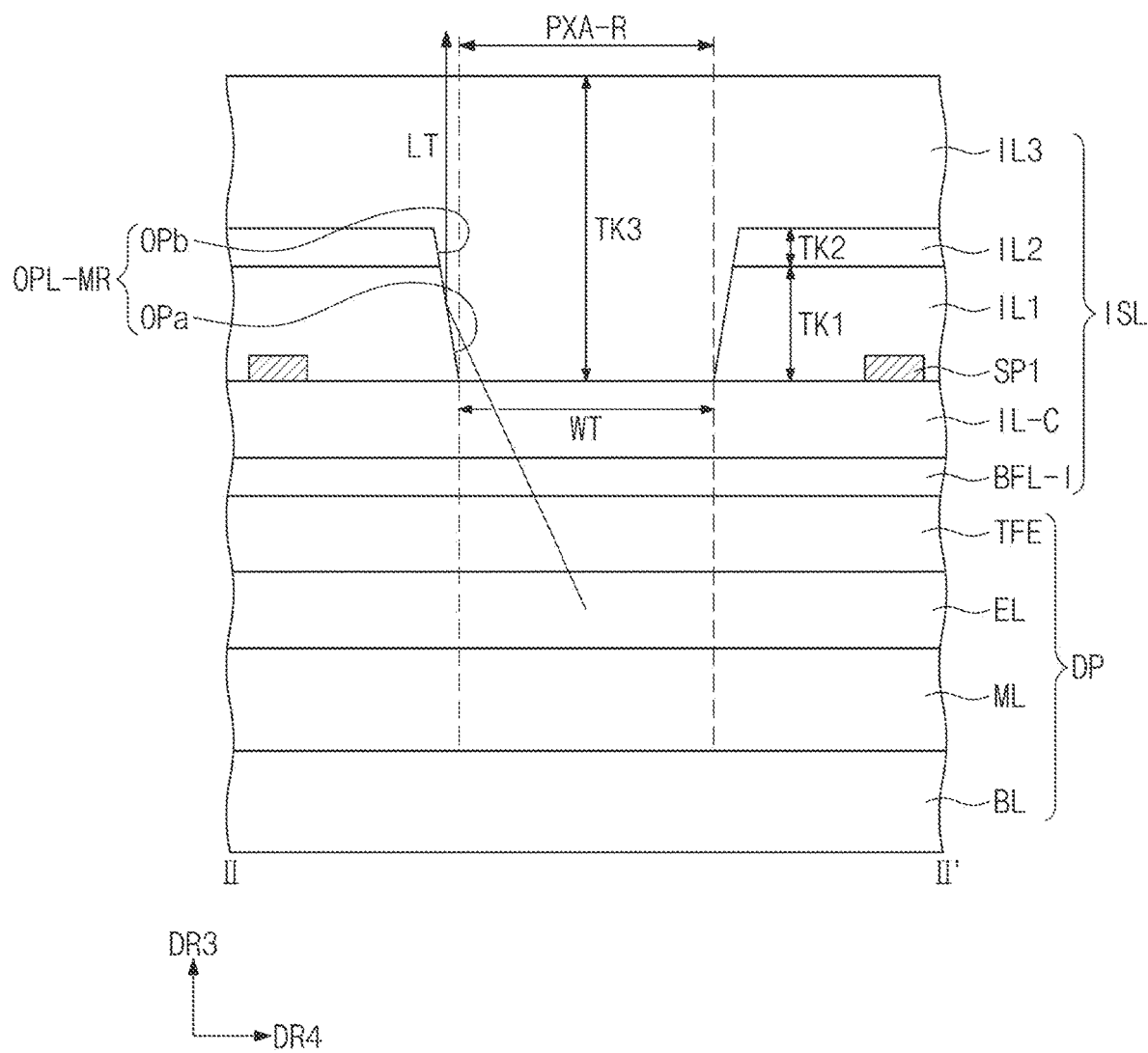
FIG. 9 is a cross-sectional view illustrating a portion taken along the line II-II' of FIG. 7.

FIG. 8 is a cross-sectional view illustrating a portion taken along the line I-I' of FIG. 6, and FIG. 9 is a cross-sectional view illustrating a portion taken along line II-II' of FIG. 7.

Referring to FIGS. 7, 8, and 9, the input sensing layer ISL may include a buffer layer BFL-I, a first conductive layer CL1, an interlayer insulating layer IL-C, a second conductive layer CL2, a first insulating layer IL1, a second insulating layer IL2, and a third insulating layer IL3.

The buffer layer BFL-I may be on the encapsulation layer TFE. The buffer layer BFL-I may contain an inorganic material. For example, the inorganic material may be silicon nitride. The buffer layer BFL-I may have a thickness of about 2000 Angstroms. However, this is an example and the material and thickness of the buffer layer BFL-I are not limited thereto. In addition, in one embodiment of the present invention, the buffer layer BFL-I may be omitted.

The first conductive layer CL1 may be on the buffer layer BFL-I. The first conductive layer CL1 may include first connection portions CP1.

The interlayer insulating layer IL-C may be on the first conductive layer CL1. The interlayer insulating layer IL-C may contain an inorganic material. For example, the inorganic material may be silicon nitride. The thickness of the interlayer insulating layer (IL-C) may be about 3000 Angstroms.

The second conductive layer CL2 may be on the interlayer insulating layer IL-C. The second conductive layer CL2 may include first sensor portions SP1, second sensor portions SP2, and second connection portions CP2.

Two first sensor portions SP1 adjacent to each other among the first sensor portions SP1 may be connected to one first connection portion CP1. The two first sensor portions SP1 may be connected to a first connection portion CP1 through a through-hole HL-I defined in the interlayer insulating layer IL-C.

In another embodiment of the present invention, the first conductive layer CL1 may include the first sensor portions SP1, the second sensor portions SP2, and the second connection portions CP2, and the second conductive layer CL2 may include the first connection portions CP1.

The first insulating layer IL1 may be on the second conductive layer CL2. The first insulating layer IL1 may have a first refractive index. The first insulating layer IL1 may contain a first organic material. The first organic material may contain at least one of an acrylic-based resin, methacrylic-based resin, polyisoprene, vinyl-based resin, epoxy-based resin, urethane-based resin, cellulose-based resin, siloxane-based resin, polyimide-based resin, polyimide-based resin, or perylene-based resin. However, these are example materials and the first organic material is not limited to these examples.

In the first insulating layer IL1, a plurality of first openings may be defined in a region which overlaps the first pixel region PXA-R, the second pixel region PXA-B, and the third pixel region PXA-G. FIG. 9 illustrates one first opening OPa. The first opening OPa may be defined in a region corresponding to the first pixel region PXA-R. For example, the first opening OPa may overlap the first pixel region PXA-R on a plane. In this specification, some of the lead-lines for the reference numerals corresponding to the openings are expressed to indicate aspects of the configuration defining the openings.

The second insulating layer IL2 may be on the first insulating layer IL1. The second insulating layer IL2 may contain an inorganic material. The inorganic material may be silicon nitride. The inorganic material may be substituted with various organic materials which may be deposited by a low temperature process. The low temperature process may mean, for example, a process carried out at a temperature of about 85 degrees or lower. However, the low-temperature range is not limited to the above example. The low temperature criterion may be determined by considering the temperature at which the material constituting the display panel DP deteriorates.

In the second insulating layer IL2, a plurality of second openings may be defined in a region corresponding to the plurality of first openings. FIG. 9 illustrates one second opening OPb. The second opening OPb may be defined in a region corresponding to the first pixel region PXA-R.

The first opening OPa and the second opening OPb may be referred to as a first lens opening OPL-MR. Referring to FIG. 7, a second lens opening OPL-MB defined in a region overlapping the second pixel region PXA-B, and a third lens opening OPL-MG defined in a region overlapping the third pixel region PXA-G are illustrated.

On a plane, a first area of the first lens opening OPL-MR, a second area of the second lens opening OPL-MB, and a third area of the third lens opening OPL-MG may be different from one another. The second area may be larger than the first area, and the first area may be larger than the third area.

The third insulating layer IL3 may be on the second insulating layer IL2. The third insulating layer IL3 may have a second refractive index. The third insulating layer IL3 may contain a second organic material. In one embodiment of the present invention, the second organic material may be selected from materials having a higher refractive index than the first organic material. In addition, in one embodiment of the present invention, the third insulating layer IL3 may contain the same material as the first organic material and a material that improves a refractive index. The material may be, for example, zirconia.

The first refractive index may be about 1.45 to about 1.55. The second refractive index may be about 1.65 to about 1.70. The difference between the second refractive index and the first refractive index may be about 0.1 or more. The ranges of the first refractive index and the second refractive index are presented as an example. Therefore, the ranges of the first and second refractive indexes are not limited to the examples, as long as the second refractive index is higher than the first refractive index.

The third insulating layer IL3 may fill the first lens opening OPL-MR, the second lens opening OPL-MB, and the third lens opening OPL-MG. In addition, the third insulating layer IL3 may also provide a flat upper surface.

Light provided from the light emitting element layer EL may be emitted in the front direction, for example, in the third direction DR3 as well as in a lateral direction. Light efficiency may be determined based on light emitted in the front direction. According to an embodiment of the present invention, the light LT emitted in a lateral direction may be refracted or totally reflected due to a difference in refractive index between the first insulating layer IL1 and the third insulating layer IL3. Accordingly, the light path of the light LT may be changed to the third direction DR3 or a direction close to the third direction DR3. As a result, the light efficiency of the display device DD (see FIG. 1) may be improved.

A first thickness TK1 of the first insulating layer IL1 may be greater than a second thickness TK2 of the second insulating layer IL2. A third thickness TK3 of the third insulating layer IL3 may be greater than the first thickness TK1 and the second thickness TK2. Each of the first thickness TK1, the second thickness TK2, and the third thickness TK3 may mean a maximum thickness.

The first thickness TK1 may be about 1.5 micrometers or more. For example, the first thickness TK1 may be about 3 micrometers to about 5 micrometers. The second thickness TK2 may be several thousand angstroms. For example, the second thickness may be about 3000 Angstroms. The third thickness TK3 may be several micrometers. For example, it may be about 5 micrometers. A width WT of the first lens opening OPL-MR may be about 1 micrometer or less. The width WT may mean a minimum width of the first lens opening OPL-MR. The numerical range is presented as an example only, and the first thickness TK1, the second thickness TK2, the third thickness TK3, and the width WT are not limited by the above numerical ranges.

Figure 10:
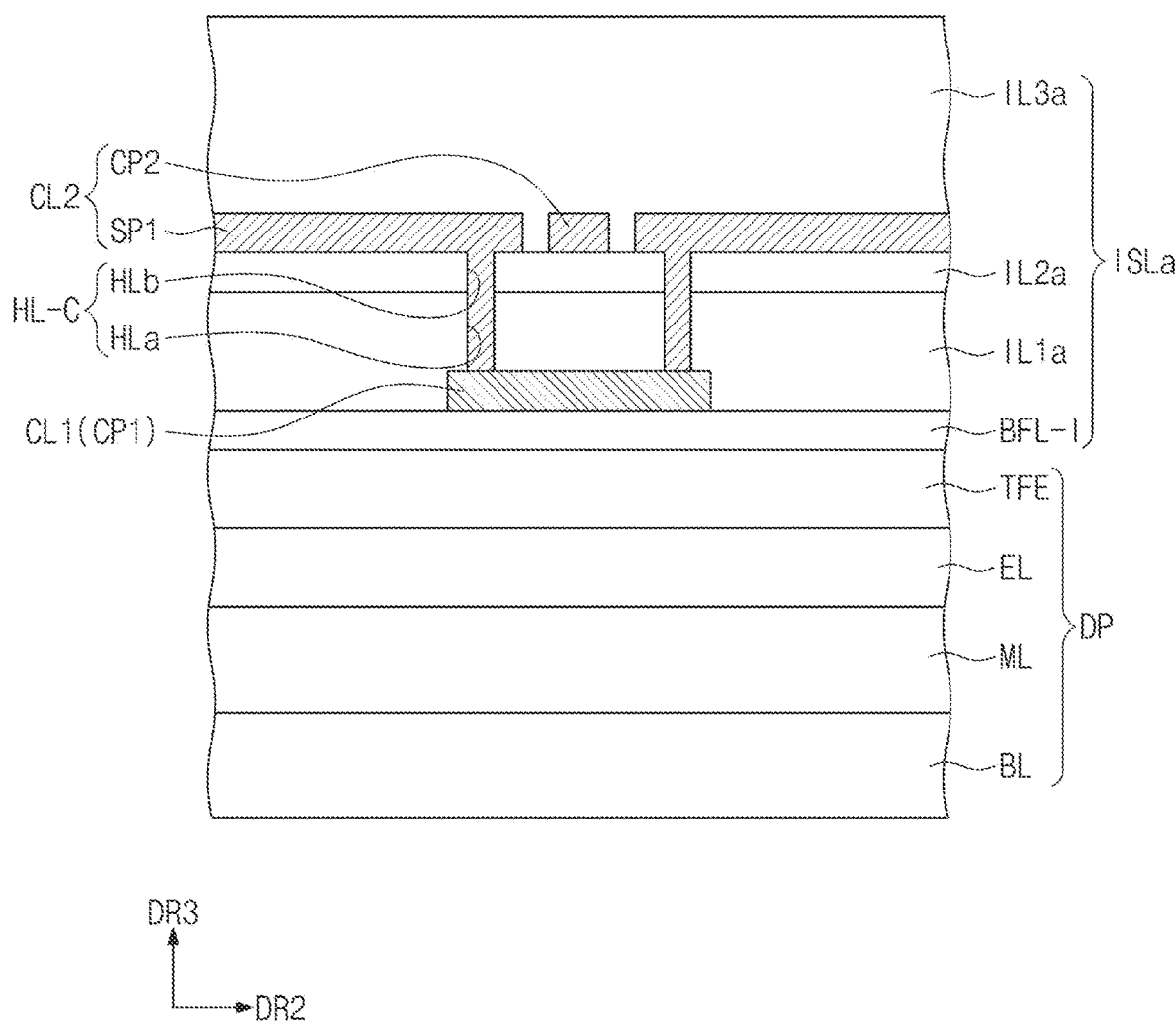
FIG. 10 is a cross-sectional view illustrating a portion taken along the line I-I' of FIG. 6 according to an embodiment of the present invention.
Figure 11:
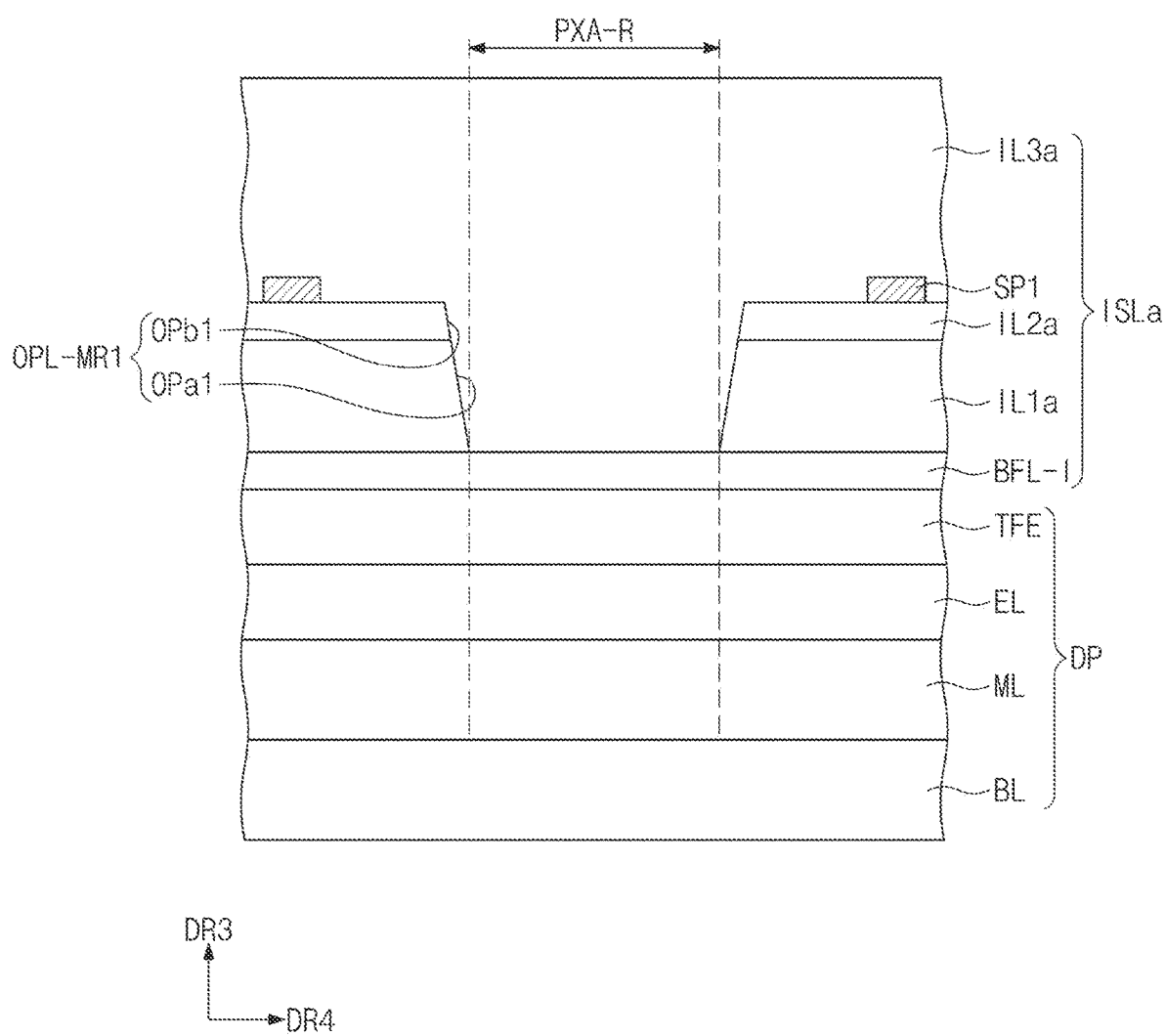
FIG. 11 is a cross-sectional view illustrating a portion taken along the line II-II' of FIG. 7 according to an embodiment of the present invention.

FIG. 10 is a cross-sectional view illustrating a portion taken along the line I-I' of FIG. 6 according to an embodiment of the present invention. FIG. 11 is a cross-sectional view illustrating a portion taken along the line II-II' of FIG. 7 according to an embodiment of the present invention.

Referring to FIGS. 10 and 11, an input sensing layer ISLa may include a buffer layer BFL-I, a first conductive layer CL1, a first insulating layer IL1a, a second insulating layer IL2a, a second conductive layer CL2, and a third insulating layer IL3a.

The first conductive layer CL1 may be on the buffer layer BFL-I. The first conductive layer CL1 may include first connection portions CP1.

The first insulating layer IL1a may be on the first conductive layer CL1, and the second insulating layer IL2a may be on the first insulating layer IL1a.

The first insulating layer IL1a has a first refractive index, and the first insulating layer IL1a may contain a first organic material. The second insulating layer IL2a may contain an inorganic material.

In the first insulating layer IL1a, a plurality of first openings may be defined in a region overlapping the first pixel region PXA-R, the second pixel region PXA-B, and the third pixel region PXA-G. In FIG. 11, one first opening OPa1 is illustrated. The first opening OPa1 may be defined in a region corresponding to the first pixel region PXA-R. For example, on a plane, the first opening OPa1 may overlap the first pixel region PXA-R.

In the second insulating layer IL2a, a plurality of second openings may be defined in a region corresponding to the plurality of first openings. In FIG. 11, one second opening OPb1 is illustrated. The second opening OPb1 may be defined in a region corresponding to the first pixel region PXA-R.

The first opening OPa1 and the second opening OPb1 may be referred to as a first lens opening OPL-MR1. According to an embodiment of the present invention, the first lens opening OPL-MR1 may be defined between the first conductive layer CL1 and the second conductive layer CL2 from a cross-sectional view. Accordingly, when compared with FIG. 9 described above, the thickness of the input sensing layer ISLa may be smaller than that of the input sensing layer ISL of FIG. 9.

The second conductive layer CL2 may be on the second insulating layer IL2a. The second conductive layer CL2 may include first sensor portions SP1, second sensor portions SP2 (see FIG. 6), and second connection portions CP2.

Two first sensor portions SP1 adjacent to each other among the first sensor portions SP1 may be connected to one first connection portion CP1. The two first sensor portions SP1 may be connected to the first connection portion CP1 through a touch contact hole HL-C defined in the first insulating layer IL1a and the second insulating layer IL2a. The touch contact hole HL-C may include a first touch contact hole HLa defined in the first insulating layer IL1a and a second touch contact hole HLb defined in the second insulating layer IL2a.

Figure 12:
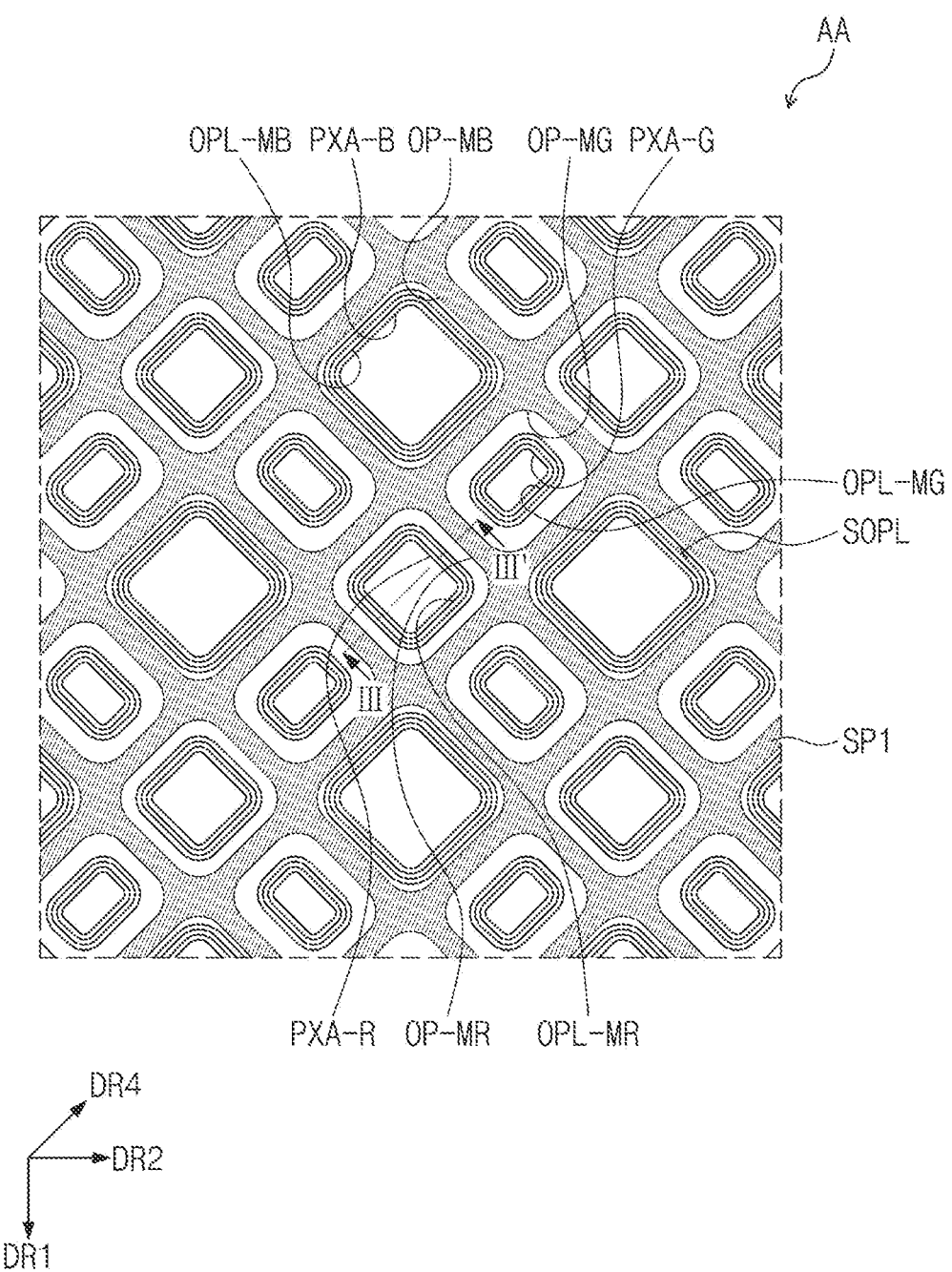
FIG. 12 is an enlarged plan view illustrating further details of the region AA of FIG. 6 according to an embodiment of the present invention.
Figure 13:
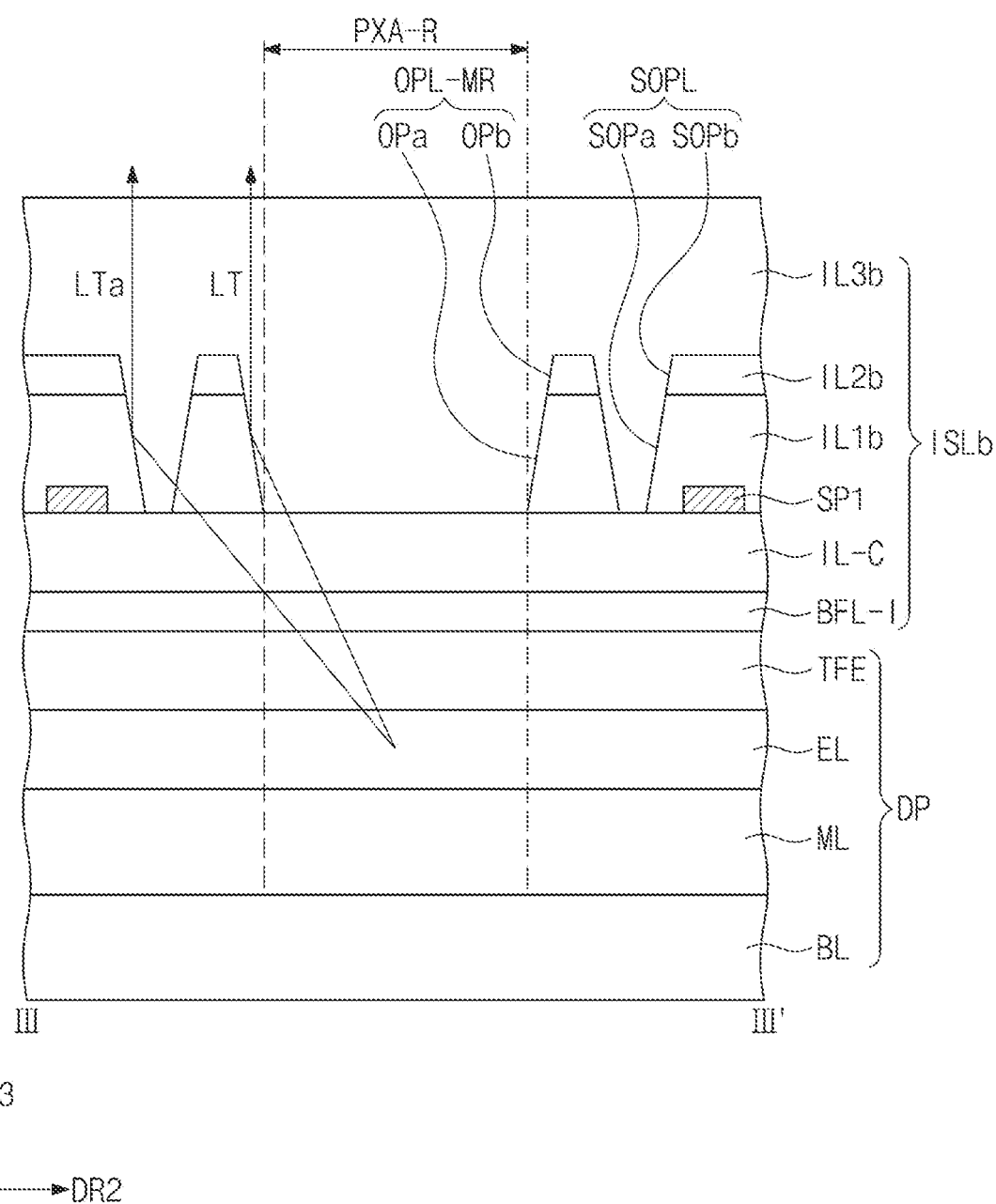
FIG. 13 is a cross-sectional view illustrating a portion taken along the line III-III' of FIG. 12.

FIG. 12 is an enlarged plan view illustrating further details of the region AA of FIG. 6 according to an embodiment of the present invention. FIG. 13 is a cross-sectional view illustrating a portion taken along the line III-III' of FIG. 12. In describing FIGS. 12 and 13, the description will be focused on portions that are different from those described in FIGS. 7 and 9.

Referring to FIGS. 12 and 13, an input sensing layer ISLb may include a buffer layer BFL-I, a first conductive layer, a second conductive layer, an interlayer insulating layer IL-C between the first conductive layer and the second conductive layer, a first insulating layer IL1b, a second insulating layer IL2b, and a third insulating layer IL3b.

A first auxiliary opening SOPa may be further defined in the first insulating layer IL1b, and a second auxiliary opening SOPb may be further defined in the second insulating layer IL2b.

The first auxiliary opening SOPa may be defined to surround the first opening OPa. The second auxiliary opening SOPb may be defined in a region corresponding to the first auxiliary opening SOPa, for example, a region overlapping the first auxiliary opening SOPa on a plane. Accordingly, the second auxiliary opening SOPb may also be defined to surround the second opening OPb.

The first auxiliary opening SOPa and the second auxiliary opening SOPb may be referred to as auxiliary lens openings SOPL. The auxiliary lens openings SOPL may be provided in plurality. The plurality of auxiliary lens openings SOPL may be defined to correspond one-to-one to and surround the peripheries of the first lens opening OPL-MR, the second lens opening OPL-MB, and the third lens opening OPL-MG.

The third insulating layer IL3b may fill the first lens opening OPL-MR, the second lens opening OPL-MB, the third lens opening OPL-MG, and the auxiliary lens openings SOPL. In addition, the third insulating layer IL3b may also provide a flat upper surface.

Lights LT and LTa emitted in a lateral direction may be refracted or totally reflected due to a difference in refractive index between the first insulating layer IL1b and the third insulating layer IL3b. According to an embodiment of the present invention, a second light LTa that is emitted more sideways than a first light LT may be totally reflected or refracted in the auxiliary lens opening SOPL. That is, the paths of the second light LTa as well as the first light LT may be changed to the third direction DR3 or a direction close to the third direction DR3. As a result, the light efficiency of the display device DD (see FIG. 1) may be improved.

FIGS. 14A to 14G are cross-sectional views illustrating a method of manufacturing a display device according to an embodiment of the present invention.

Figure 14A:
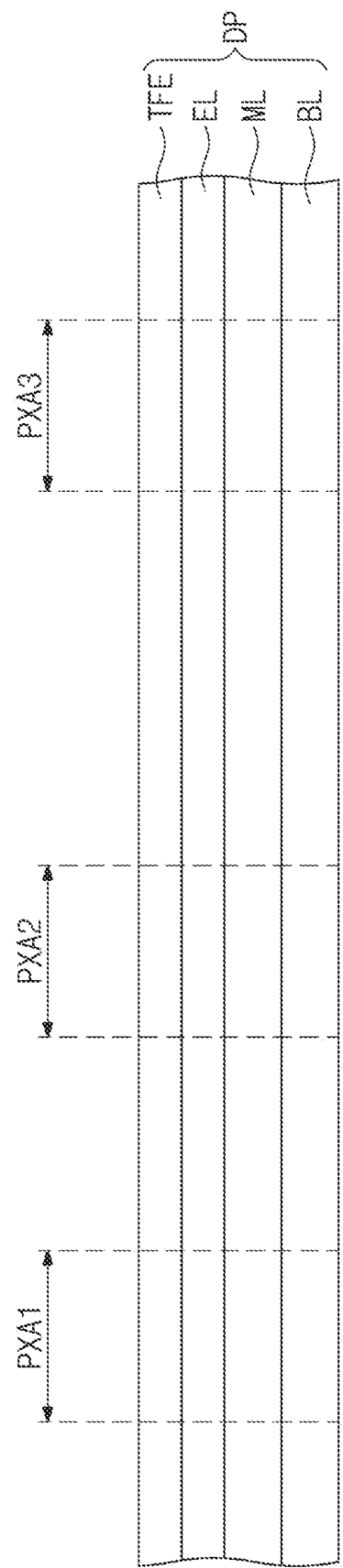
FIGS. 14A to 14G are cross-sectional views illustrating a method of manufacturing a display device according to an embodiment of the present invention.

Referring to FIG. 14A, a display panel DP including a plurality of pixel regions PXA1, PXA2, and PXA3 is formed.

The forming of the display panel DP may include forming a base layer BL, forming a circuit layer ML on the base layer BL, forming a light-emitting element layer EL on the circuit layer ML, and forming an encapsulation layer TFE on the light-emitting element layer EL.

Each of the plurality of pixel regions PXA1, PXA2, and PXA3 may correspond to each of the first pixel regions PXA-R, the second pixel regions PXA-B, and the third pixel regions PXA-G described above with reference to FIG. 7.

Figure 14B:
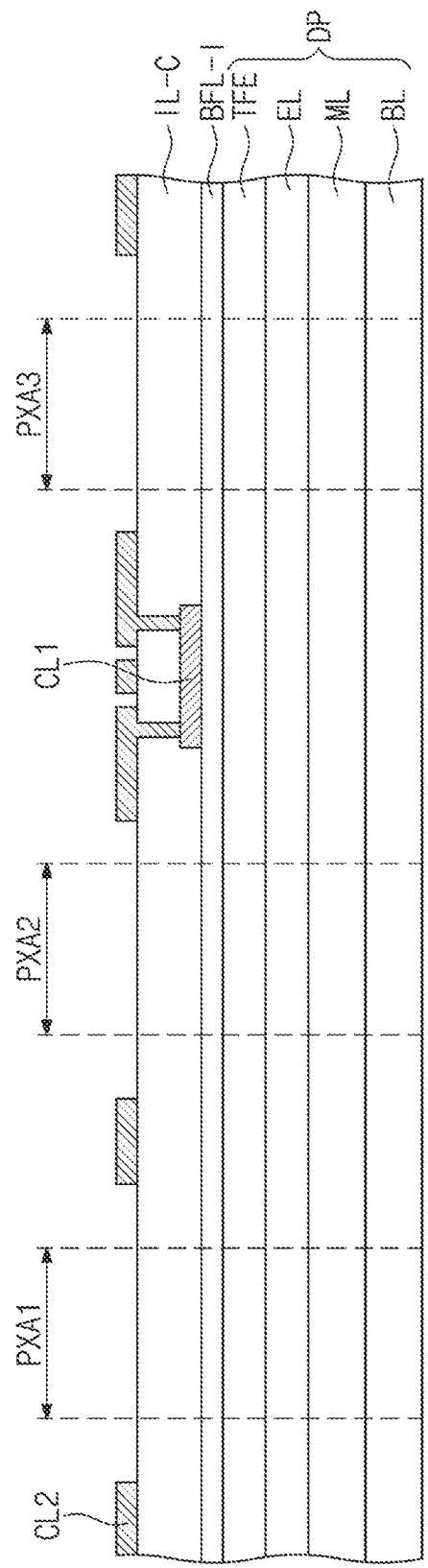

Referring to FIG. 14B, a buffer layer BFL-I is formed on the display panel DP. A first conductive layer CL1 is formed on the buffer layer BFL-I. An interlayer insulating layer IL-C is formed on the first conductive layer CL1. A second conductive layer CL2 is formed on the interlayer insulating layer IL-C.

Figure 14C:
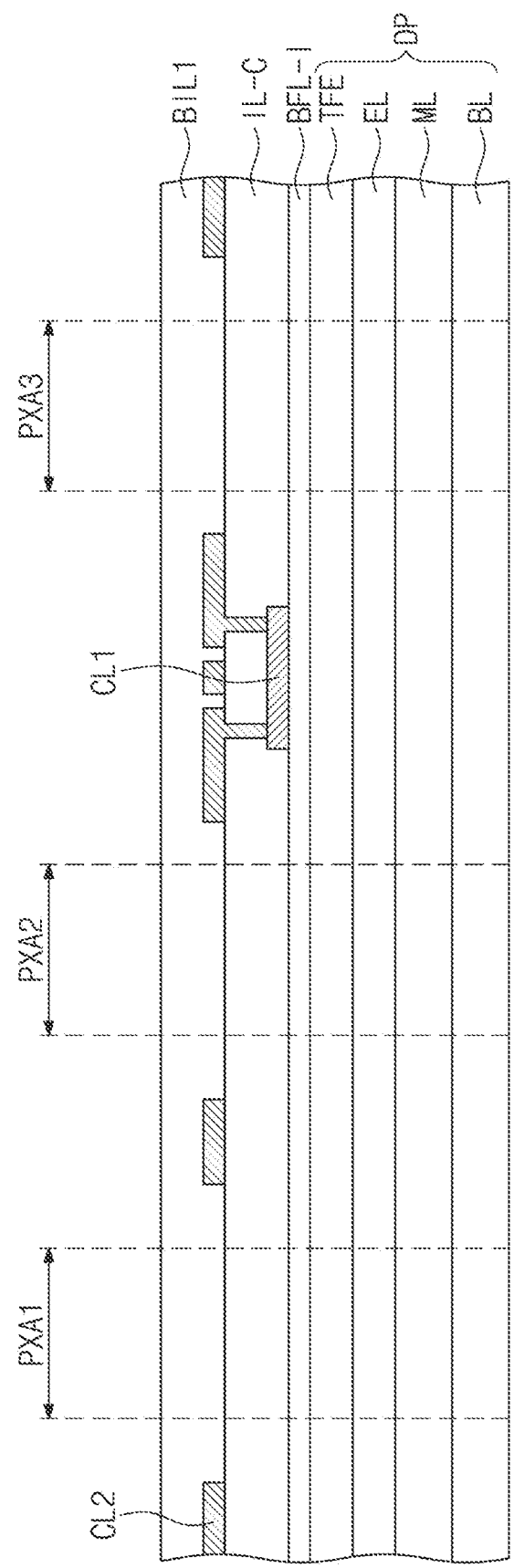

Referring to FIG. 14C, a first preliminary layer BIL1 is formed on the second conductive layer CL2. The first preliminary layer BIL1 may be a layer having a first refractive index. The first preliminary layer BIL1 may be composed of an organic material. The first preliminary layer BIL1 may be formed in a low temperature environment. The low temperature may mean, for example, a temperature for a process carried out at a temperature of about 85 degrees or less.

Figure 14D:
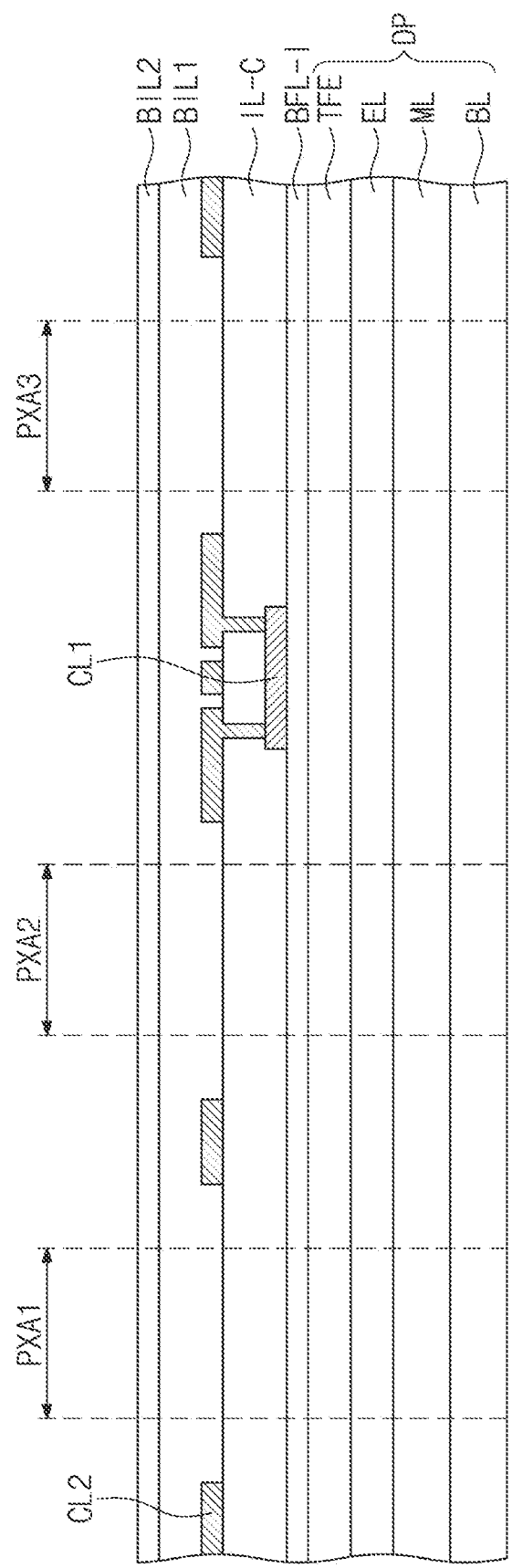

Referring to FIG. 14D, a second preliminary layer BIL2 is formed on the first preliminary layer BIL1. The second preliminary layer BIL2 may contain an inorganic material. The second preliminary layer BIL2 may contain a light-transmitting material or a light-blocking material. The second preliminary layer BIL2 may be formed in a low temperature environment. The low temperature may mean, for example, a temperature for a process carried out at a temperature of about 85 degrees or less.

Figure 14E:
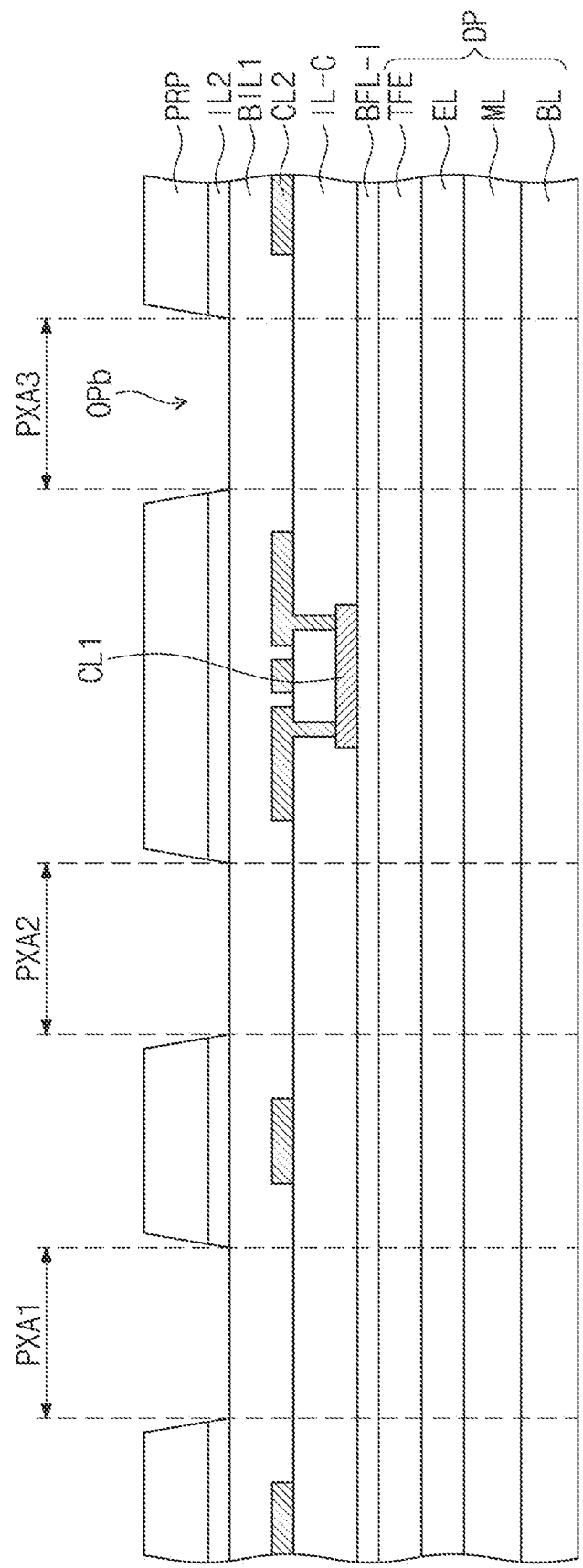

Referring to FIG. 14E, a photoresist pattern PRP is formed on the second preliminary layer BIL2. Although not illustrated, the photoresist pattern PRP may be formed by patterning a photoresist layer. The patterning may include an exposure process and a development process. The photoresist pattern PRP may contain a negative photoresist material or a positive photoresist material. For example, when the photoresist pattern PRP contains a negative photoresist material, the photoresist pattern PRP may be a portion that is irradiated with light. When the photoresist pattern PRP is a positive photoresist material, the photoresist pattern PRP may be a portion that is not irradiated with light.

Using the photoresist pattern PRP as a mask, the second preliminary layer BIL2 is patterned to form the mask IL2. The mask IL2 may also be referred to as a second insulating layer IL2. Mask openings OPb may be provided in the mask IL2. The mask openings OPb may also be referred to as second openings OPb. The mask openings OPb may be provided in a region overlapping a plurality of pixel regions PXA1, PXA2, and PXA3 on a plane.

Figure 14F:
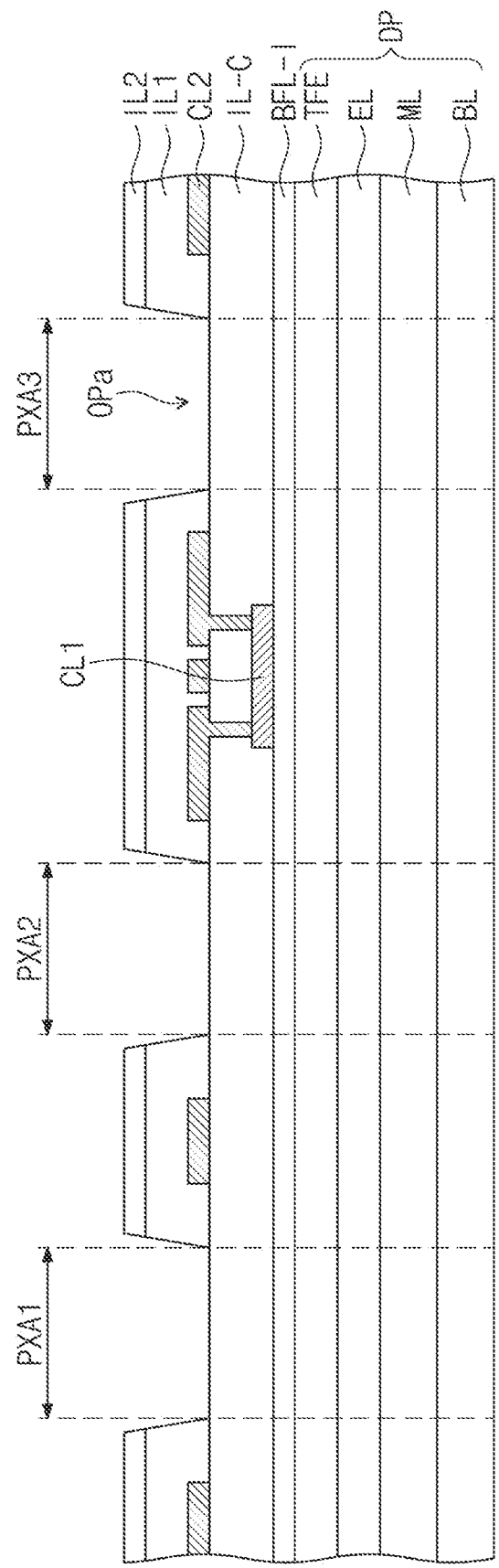

Referring to FIG. 14F, by using the mask IL2 to pattern the first preliminary layer BIL1, the first insulating layer IL1 is formed. The process of patterning the first preliminary layer BIL1 may include an etching process. The etching process may include a dry etching process. The photoresist pattern PRP may be removed during the process of patterning the first preliminary layer BIL1, or the photoresist pattern PRP may be removed by using a separate additional process.

First openings OPa may be formed in the first insulating layer IL1. The first openings OPa may overlap the plurality of pixel regions PXA1, PXA2, and PXA3 on a plane.

According to an embodiment of the present invention, when the first openings OPa are formed, a mask IL2 composed of an inorganic material may be used. In addition, the first openings OPa may be formed by a dry etching process using gas reaction.

According to a comparative example of the present invention, the first insulating layer may contain a photosensitive material, and the first openings in the first insulating layer may be formed by using an exposure process and a development process. In this case, there are disadvantages in that a deviation occurs in the inclinations of the first openings and the degree of accuracy for patterning is insufficient due to the material properties of a photosensitive material. The deviation may cause a dispersion of optical properties, and a residual film may be generated due to a lack of accuracy in patterning, which may cause a decrease in process reliability. In addition, when the material of a photosensitive material constituting the first insulating layer is changed, there is an inconvenience of redesigning process conditions for exposing and developing the first insulating layer.

However, according to an embodiment of the present invention, the first openings OPa may be formed by using a dry etching process. The dry etching process has advantages of high pattern formation accuracy and easy high-resolution patterning. Therefore, as the first openings OPa are formed in the first insulating layer IL1 by using the mask IL2, the deviation in the inclinations of the first openings OPa may be reduced, and patterning accuracy may be improved. As the deviation decreases, the dispersion of optical properties is reduced, thus improving display quality. In addition, as the accuracy of patterning is improved, the first openings OPa may be easily provided even in a high-resolution display device.

In addition, since the accuracy of pattern formation in the dry etching process is high, the first openings OPa may be easily formed even though the thickness of the first insulating layer IL1 becomes great. Therefore, even though the thickness of the first insulating layer IL1 is about 3 micrometers or more, the first openings OPa may be easily formed.

Figure 14G:
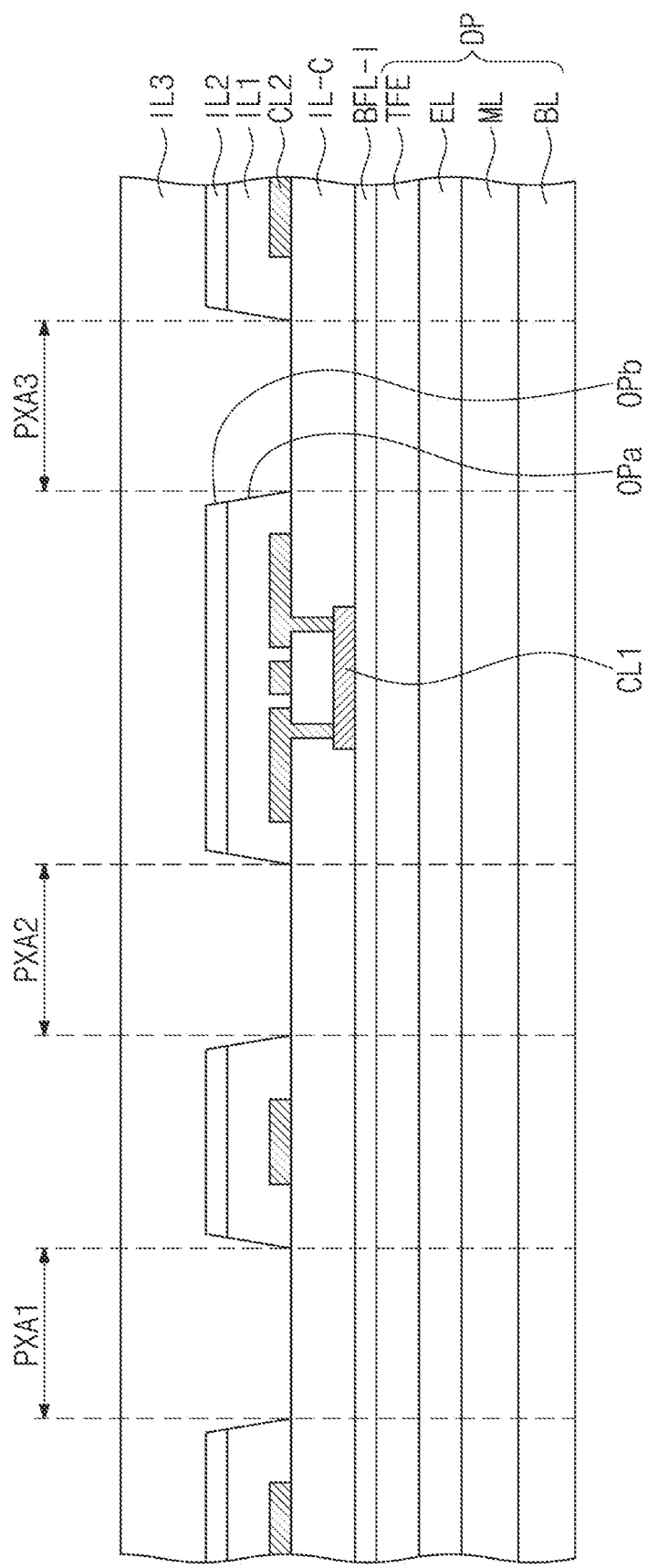

Referring to FIG. 14G, a cover layer IL3 having a second refractive index higher than a first refractive index is formed on the mask IL2. The cover layer IL3 may be referred to as a third insulating layer IL3.

Figure 15A:
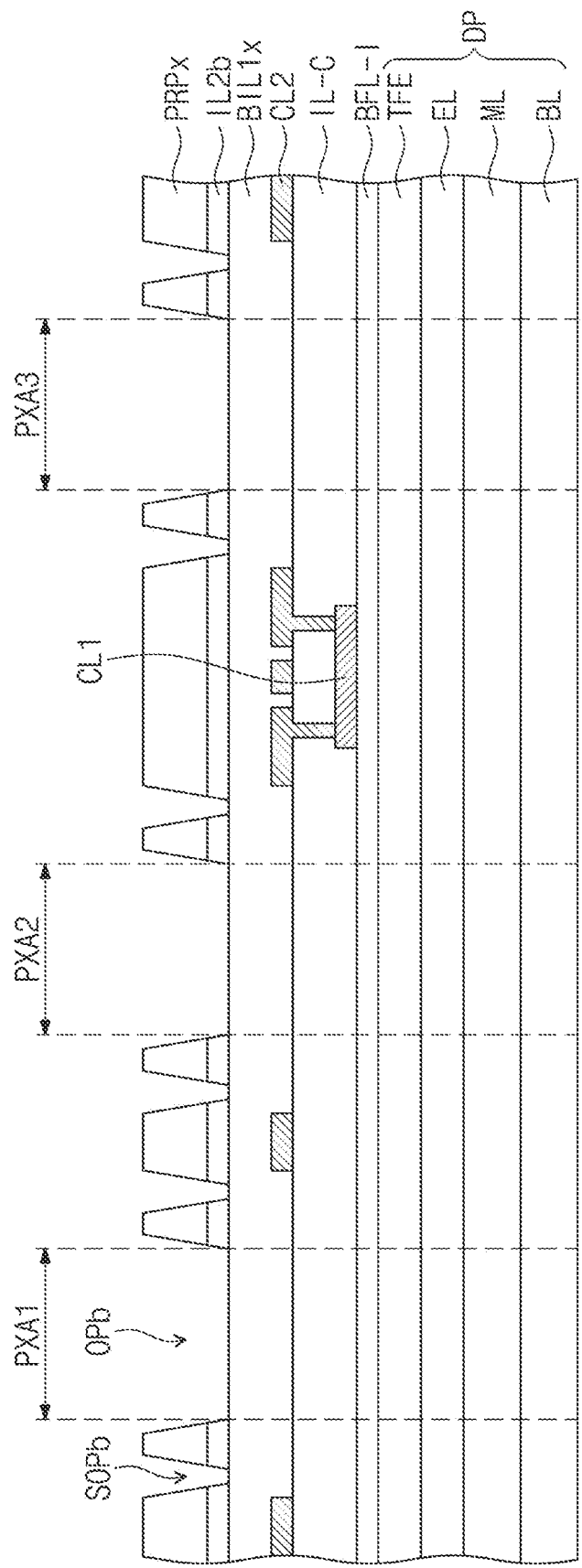
FIGS. 15A to 15C are cross-sectional views illustrating a method of manufacturing a display device according to an embodiment of the present invention.
Figure 15B:
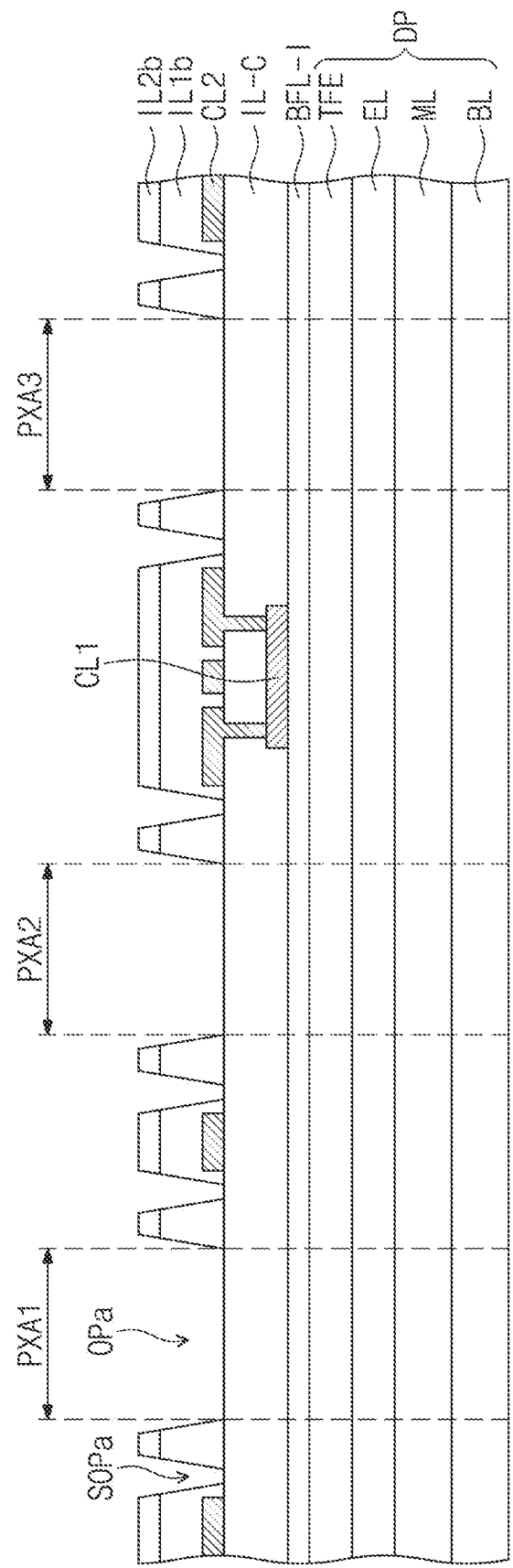
Figure 15C:
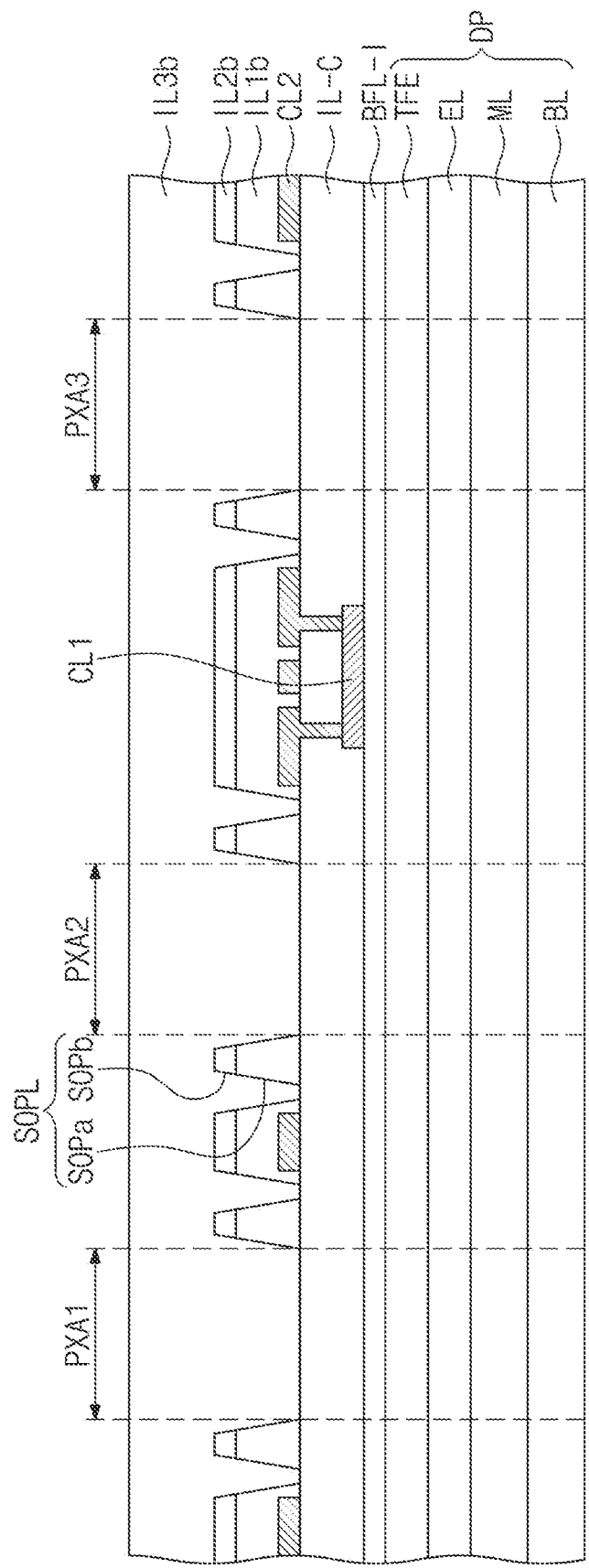

FIGS. 15A to 15C are cross-sectional views illustrating a method of manufacturing a display device according to an embodiment of the present invention.

Referring to FIG. 15A, a first preliminary layer BIL1x is formed on the second conductive layer CL2. The first preliminary layer BIL1x may be a layer having a first refractive index. The first preliminary layer BIL1x may be composed of an organic material. The first preliminary layer BIL1x may be formed in a low temperature environment. Low temperature may mean, for example, a temperature for a process carried out at a temperature of about 85 degrees or less.

A second preliminary layer (not illustrated) is formed on the first preliminary layer BIL1x, and a photoresist layer (not illustrated) is formed on the second preliminary layer. The photoresist layer (not illustrated) is exposed and developed to form a photoresist pattern PRPx. A mask IL2b is formed by using the photoresist pattern PRPx to pattern the second preliminary layer. The mask IL2b may contain an inorganic material. For example, silicon nitride may be contained. The mask IL2b may be referred to as a second insulating layer IL2b.

Mask openings OPb and auxiliary mask openings SOPb may be formed in the mask IL2b. The auxiliary mask openings SOPb may surround the mask openings OPb. One auxiliary mask opening may surround one mask opening.

Referring to FIG. 15B, by using the mask IL2b to pattern the first preliminary layer BIL1x, the first insulating layer IL1b is formed. The process of patterning the first preliminary layer BIL1x may include an etching process. The etching process may be a dry etching process.

First openings OPa and first auxiliary openings SOPa may be formed in the first insulating layer IL1b. One first auxiliary opening may be formed to surround one first opening.

Referring to FIG. 15C, a cover layer IL3b having a second refractive index higher than a first refractive index is formed on the mask IL2b. The cover layer IL3b may be referred to as a third insulating layer IL3b. The first openings OPa, the second openings OPb, the first auxiliary openings SOPa, and the second auxiliary openings SOPb may be filled with the cover layer IL3b. Accordingly, light may be totally reflected or refracted due to a difference in refractive index between the cover layer IL3b filling the openings and the first insulating layer IL1b, and as a result, light efficiency may be improved.

FIGS. 16A to 16F are cross-sectional views illustrating a method of manufacturing a display device according to an embodiment of the present invention.

Figure 16A:
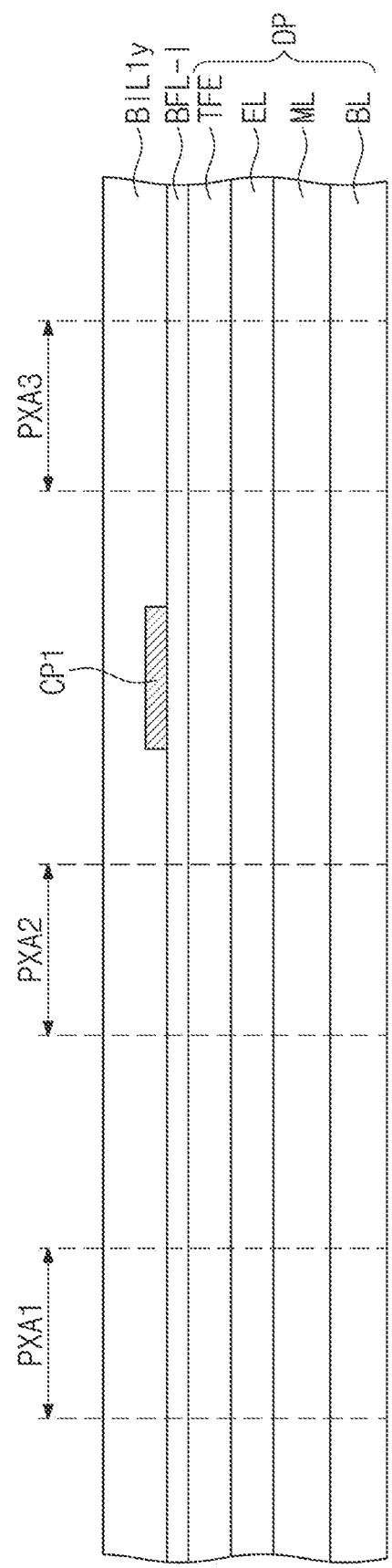
FIGS. 16A to 16F are cross-sectional views illustrating a method of manufacturing a display device according to an embodiment of the present invention.

Referring to FIG. 16A, a first connection portion CP1 is formed on a buffer layer BFL-I. A first preliminary layer BIL1y is formed on the first connection portion CP1. The first preliminary layer BIL1y may be a layer having a first refractive index. The first preliminary layer BIL1y may be composed of an organic material. The first preliminary layer BIL1y may be formed in a low temperature environment.

Figure 16B:
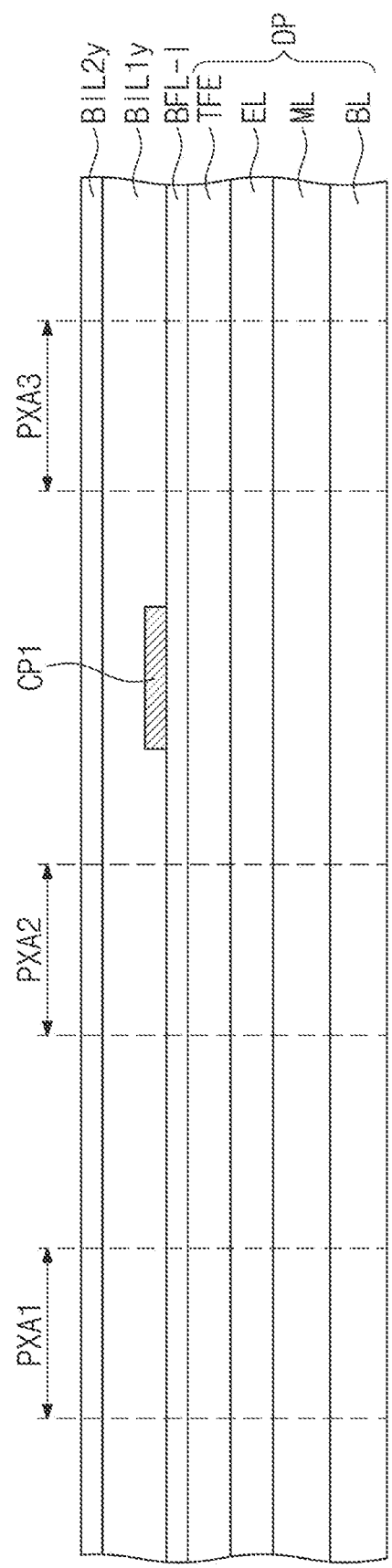

Referring to FIG. 16B, a second preliminary layer BIL2y is formed on a first preliminary layer BIL1y. The second preliminary layer BIL2y may include an inorganic material. The second preliminary layer BIL2y may be formed in a low temperature environment.

Figure 16C:
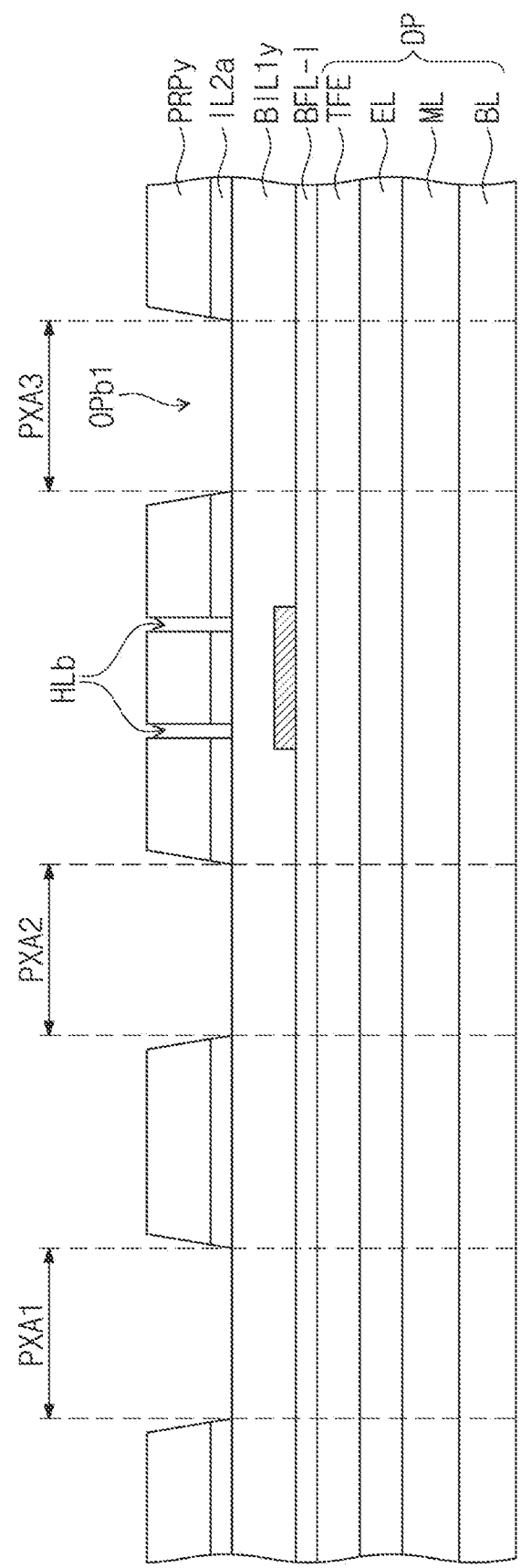

Referring to FIG. 16C, a photoresist pattern PRPy is formed on a second preliminary layer BIL2y. The photoresist pattern PRPy may be formed by exposing and developing a photoresist layer.

A mask IL2a is formed by using the photoresist pattern PRPy to pattern the second preliminary layer BIL2y. The mask IL2a may also be referred to as a second insulating layer IL2a. Openings OPb1 defined to correspond to pixel regions PXA1, PXA2, and PXA3 and touch contact holes HLb overlapping a first connection portion CP1 may be formed in the mask IL2a.

Figure 16D:
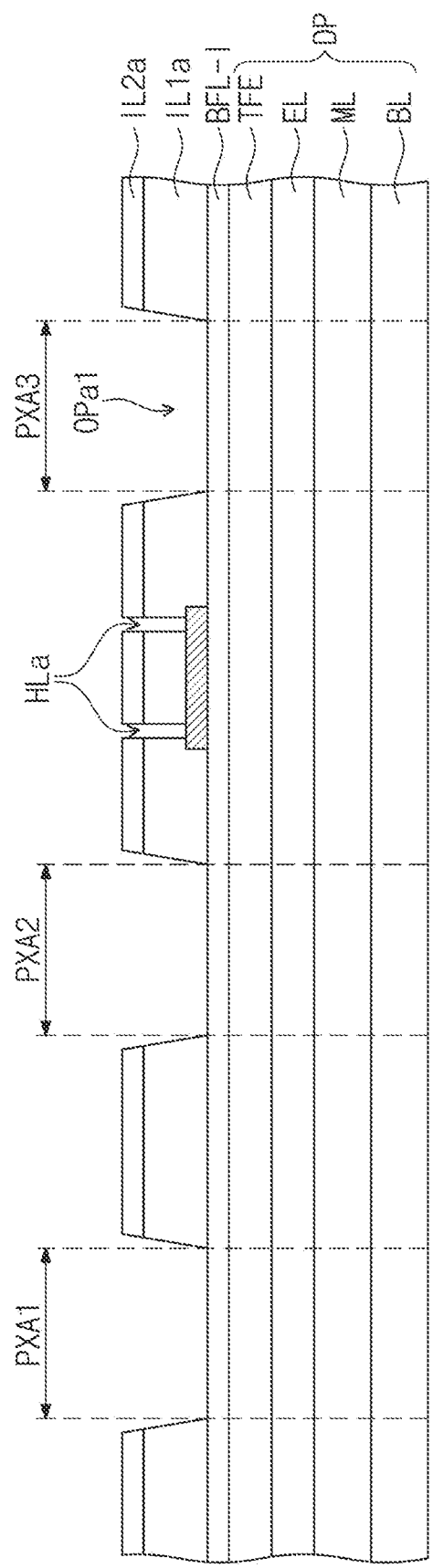

Referring to FIG. 16D, a first insulating layer IL1a is formed by using the mask IL2a to pattern the first preliminary layer BIL1y. First openings Opa1 overlapping the pixel regions PXA1, PXA2, and PXA3 and touching contact holes HLa overlapping the first connection portion CP1 may be formed in the first insulating layer IL1a.

Figure 16E:
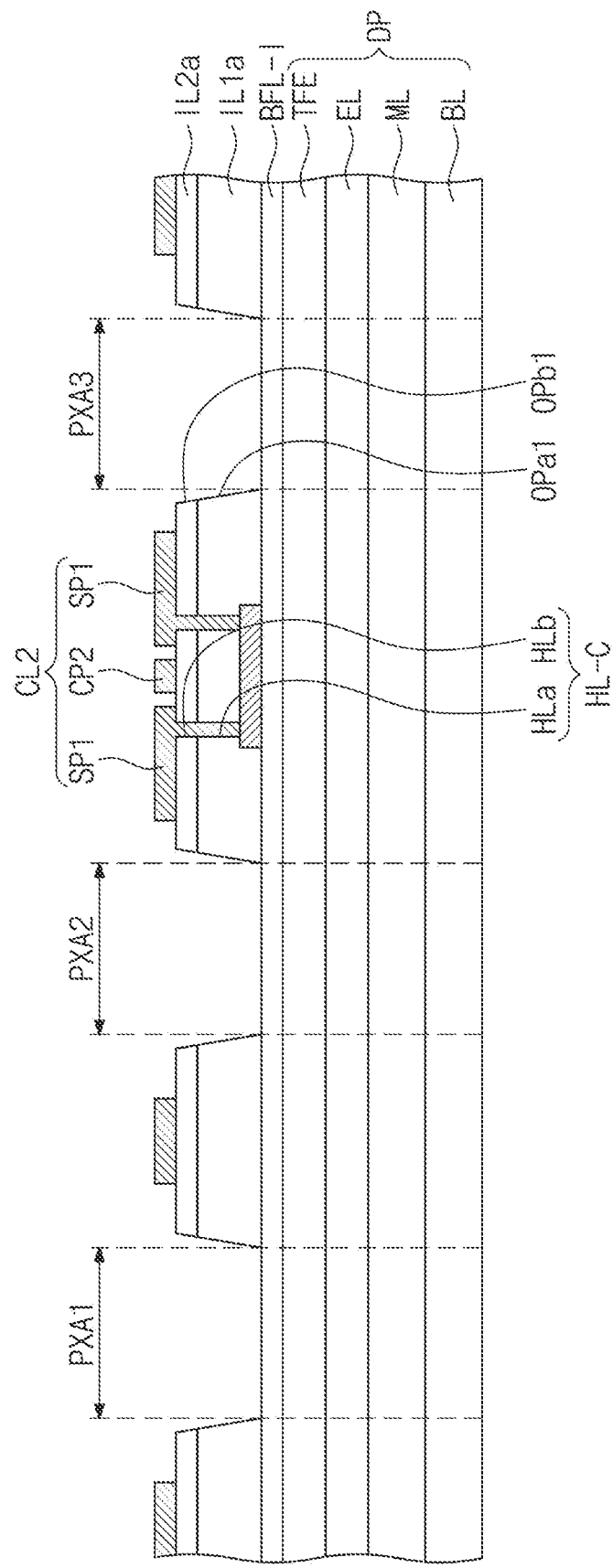

Referring to FIG. 16E, the touch contact holes HLa of the first insulating layer IL1a and the touch contact holes HLb of the mask IL2a may overlap each other on a plane to constitute touch contact holes HL-C.

A second conductive layer CL2 is formed on the mask IL2a. The second conductive layer CL2 may include first sensor portions SP1, second sensor portions SP2 (see FIG. 6), and a second connection portion CP2. One of the two adjacent first sensor portions SP1 may penetrate through one of the touch contact holes to contact a first connection portion CP1, and the other adjacent first sensor portion may penetrate the other touch contact hole to contact the first connection portion CP1.

Figure 16F:
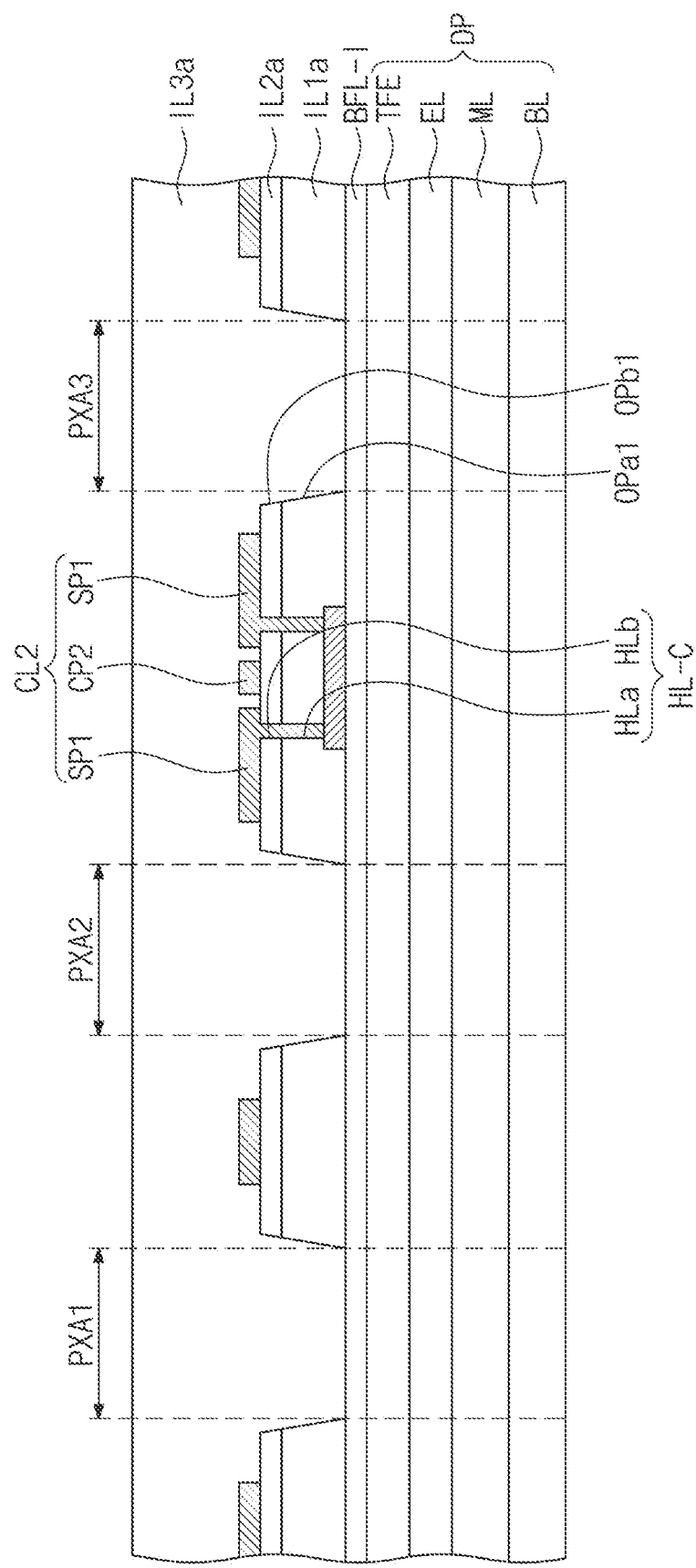

Referring to FIG. 16F, a cover layer IL3a having a second refractive index higher than a first refractive index is formed on the mask IL2a. The cover layer IL3a may also be referred to as a third insulating layer IL3a. The first openings OPa1 and the second openings OPb1 may be filled with the cover layer IL3a. Accordingly, light may be totally reflected or refracted due to a difference in refractive index between the cover layer IL3a filling the openings and the first insulating layer IL1a, and as a result, light efficiency may be improved.

Although the present invention has been described with reference to preferred embodiments thereof, those skilled in the art or those of ordinary skill in the art will understand that various modifications and changes can be made to the present invention within the scope, and without departing from the spirit and technical field of the present invention described in the claims to be described later. Accordingly, the technical scope of the present invention should not be limited to the content described in the detailed description of the specification, but should be determined by the claims as hereinafter described.

INDUSTRIAL APPLICABILITY

The present invention, which improves the image quality and light output efficiency of a display device, has high industrial applicability.

What is claimed is:

1. A display device comprising:
a display panel comprising a pixel region;
an insulating layer on the display panel, the insulating layer comprising an opening overlapping the pixel region and an auxiliary opening spaced from the opening and surrounding the opening; and
a cover insulating layer covering the display panel and the insulating layer, and overlapping the pixel region on a plane,
wherein both the opening and the auxiliary opening are provided recessed from a top surface of the insulating layer, and
wherein the opening and the auxiliary opening do not overlap each other on a plane.

2. The display device of claim 1, wherein portions of the cover insulating layer are filled in the opening and the auxiliary opening.

3. The display device of claim 1, wherein the cover insulating layer comprises a flat upper surface.

4. The display device of claim 1, wherein the auxiliary opening does not overlap the pixel region.

5. The display device of claim 1, wherein the cover insulating layer comprises an organic material.

6. The display device of claim 1, wherein the insulating layer comprises:
a first insulating layer on the display panel; and
a second insulating layer directly on the first insulating layer, and
wherein the opening and the auxiliary opening are defined in both the first insulating layer and the second insulating layer.

7. The display device of claim 6, wherein the first insulating layer has a first refractive index, and the cover insulating layer has a second refractive index that is higher than the first refractive index.

8. The display device of claim 7, wherein the first refractive index is about 1.45 to about 1.55, and the second refractive index is about 1.60 to about 1.70.

9. The display device of claim 6, wherein the first insulating layer comprises an organic material, and the second insulating layer comprises an inorganic material.

10. The display device of claim 6, wherein a thickness of the first insulating layer is greater than a thickness of the second insulating layer.

11. A display device comprising:
a display panel comprising a pixel region;
an insulating layer on the display panel, the insulating layer comprising an opening overlapping the pixel region and an auxiliary opening spaced from the opening and adjacent to the opening; and
a cover insulating layer covering the display panel, and the insulating layer, and overlapping the pixel region on a plane,
wherein the auxiliary opening has a ring shape by two spaced apart side walls of the insulating layer.

12. The display device of claim 11, wherein a width of the auxiliary opening is smaller than a width of the opening.

13. The display device of claim 11, wherein the auxiliary opening surrounds the opening on a plane.

14. The display device of claim 11, wherein the opening and the auxiliary opening do not overlap each other on a plane.

15. The display device of claim 11, wherein a depth of the opening is substantially the same as a depth of the auxiliary opening.

16. The display device of claim 11, wherein the cover insulating layer comprises an organic material and a flat upper surface.

17. The display device of claim 11, wherein the insulating layer comprises:
a first insulating layer on the display panel; and
a second insulating layer directly on the first insulating layer, and
wherein the opening and the auxiliary opening are defined in both the first insulating layer and the second insulating layer.

18. The display device of claim 17, wherein the first insulating layer has a first refractive index, and the cover insulating layer has a second refractive index that is higher than the first refractive index.

19. The display device of claim 17, wherein the first insulating layer comprises an organic material, and the second insulating layer comprises an inorganic material.

20. The display device of claim 17, wherein a thickness of the first insulating layer is greater than a thickness of the second insulating layer.

* * * * *